(12) United States Patent
Toya

(10) Patent No.: US 10,326,178 B2
(45) Date of Patent: Jun. 18, 2019

(54) BATTERY PACK

(71) Applicant: Panasonic Intellectual Property Management Co., Ltd., Osaka (JP)

(72) Inventor: Shoichi Toya, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 807 days.

(21) Appl. No.: 14/770,628

(22) PCT Filed: Jan. 15, 2014

(86) PCT No.: PCT/JP2014/000143
§ 371 (c)(1),
(2) Date: Aug. 26, 2015

(87) PCT Pub. No.: WO2014/155903
PCT Pub. Date: Oct. 2, 2014

(65) Prior Publication Data
US 2016/0006085 A1    Jan. 7, 2016

(30) Foreign Application Priority Data

Mar. 29, 2013  (JP) .................................. 2013-073865

(51) Int. Cl.
*H01M 10/48* (2006.01)
*H01M 2/10* (2006.01)
(Continued)

(52) U.S. Cl.
CPC ...... *H01M 10/482* (2013.01); *G01R 31/3648* (2013.01); *H01M 2/1016* (2013.01);
(Continued)

(58) Field of Classification Search
CPC ................ G01R 31/36; G01R 31/3606; G01R 31/3658; H01M 10/00; H01M 10/02;
(Continued)

(56) References Cited

U.S. PATENT DOCUMENTS

2009/0009176 A1* 1/2009 Nakao ................ G01R 31/3655
324/432
2009/0257369 A1  10/2009 Igarashi et al.
(Continued)

FOREIGN PATENT DOCUMENTS

CN    101562873    10/2009
CN    102812618    12/2012
(Continued)

OTHER PUBLICATIONS

Office Action dated Apr. 5, 2017 in corresponding Chinese Application No. 201480013943.6, with Partial English Translation.
(Continued)

*Primary Examiner* — Benyam Haile
(74) *Attorney, Agent, or Firm* — Wenderoth, Lind & Ponack, L.L.P.

(57) ABSTRACT

A battery pack having a housing and a secondary battery inside the housing, and including a communicator that receives an instruction related to the secondary battery from an external communication terminal device via short-distance wireless communication and a controller that executes an operation in accordance with the instruction by using a status of the secondary battery. The external communication terminal device, by transmitting to the battery pack the instruction, which is related to the status of the secondary battery, acquires a response that is in accordance with the status of the secondary battery from the battery pack, thereby facilitating checking of secondary battery state.

17 Claims, 21 Drawing Sheets

(51) Int. Cl.
*G01R 31/36* (2019.01)
*H02J 7/00* (2006.01)
*H02J 13/00* (2006.01)
*H01M 10/42* (2006.01)

(52) U.S. Cl.
CPC .......... *H01M 10/48* (2013.01); *H02J 7/0021* (2013.01); *H02J 7/0045* (2013.01); *H02J 13/0003* (2013.01); *H01M 2010/4278* (2013.01); *H02J 2007/005* (2013.01); *Y02T 10/7055* (2013.01)

(58) Field of Classification Search
CPC ............ H01M 10/4207; H01M 10/42; H01M 10/4242; H01M 10/44; H01M 10/46; H01M 10/441; H01M 10/48; H01M 10/482; H01M 10/488; H01M 10/4271
See application file for complete search history.

(56) References Cited

U.S. PATENT DOCUMENTS

| | | | | |
|---|---|---|---|---|
| 2011/0063119 | A1* | 3/2011 | Martin | H01M 10/48 340/636.19 |
| 2011/0221389 | A1 | 9/2011 | Won et al. | |
| 2012/0206102 | A1* | 8/2012 | Okamura | H01M 10/425 320/112 |
| 2014/0091751 | A1* | 4/2014 | Workman | H02J 7/0013 320/106 |
| 2016/0056510 | A1* | 2/2016 | Takeuchi | H01M 10/482 429/7 |

FOREIGN PATENT DOCUMENTS

| | | |
|---|---|---|
| EP | 2 280 436 | 2/2011 |
| JP | 2000-294298 | 10/2000 |
| JP | 2003-153453 | 5/2003 |
| JP | 2004-31285 | 1/2004 |
| JP | 2007-267519 | 10/2007 |
| JP | 2011-49151 | 3/2011 |
| JP | 2012-170262 | 9/2012 |
| JP | 2012-222913 | 11/2012 |
| JP | 2012222913 A * | 11/2012 |
| WO | 2012/124238 | 9/2012 |

OTHER PUBLICATIONS

International Search Report dated Apr. 1, 2014 in corresponding International Application No. PCT/JP2014/000143 (with English translation).

* cited by examiner

FIG. 12A
FIG. 12B
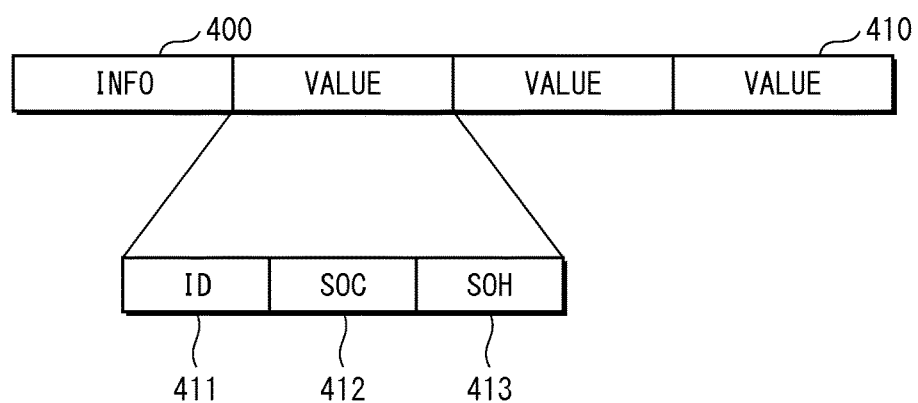
FIG. 12C
| ID (411) | SOC (412) | SOH (413) | 410 |
|---|---|---|---|
| ID | SOC | SOH | |
| 101 | 60 | GOOD | |
| 102 | 90 | GOOD | |
| 103 | 50 | NG | |

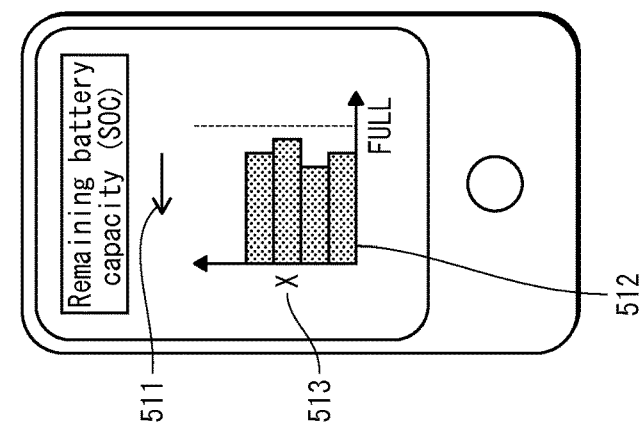
FIG. 13C
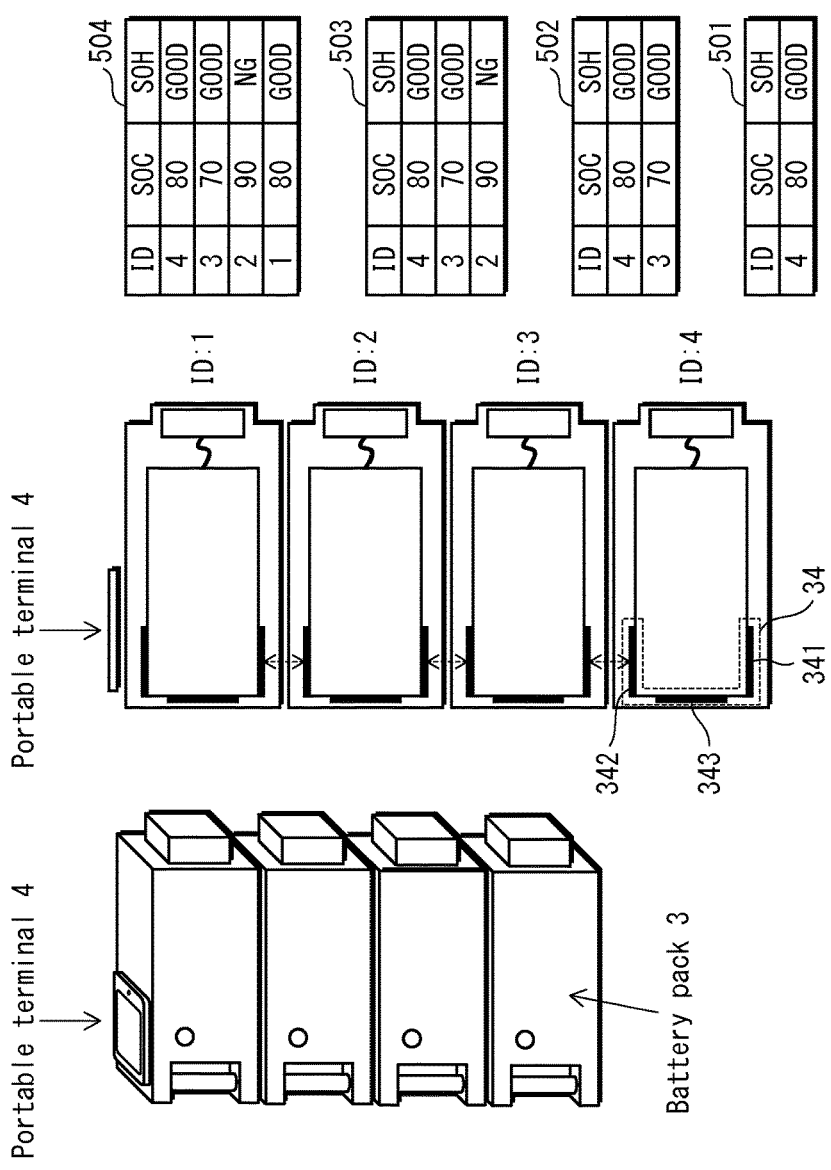
FIG. 13B
FIG. 13A

FIG. 17A
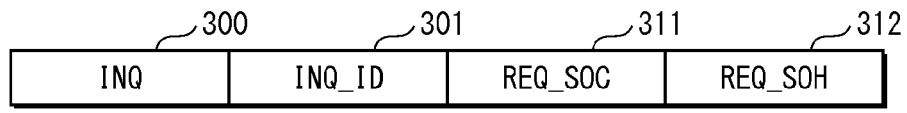
FIG. 17B
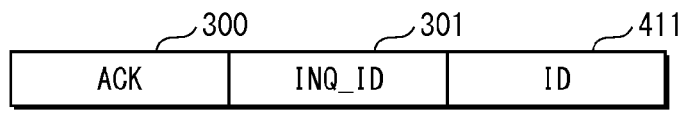
FIG. 17C
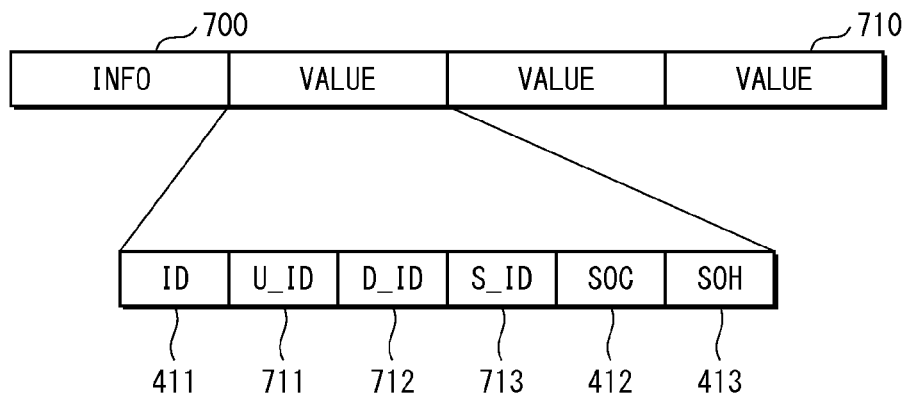
FIG. 17D
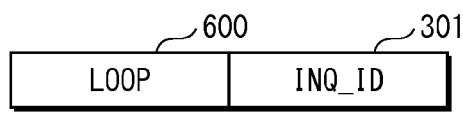
FIG. 17E
| ID | U_ID | D_ID | S_ID | SOC | SOH |
|---|---|---|---|---|---|
| 201 | — | 202 | — | 60 | GOOD |
| 202 | 201 | 203 | — | 90 | GOOD |
| 203 | 202 | — | 204 | 50 | NG |
| 204 | — | — | 203 | 80 | GOOD |

FIG. 19A

| ID | U_ID | D_ID | S_ID | SOC | SOH |
|---|---|---|---|---|---|
| 31 | – | – | – | 100 | GOOD |

FIG. 19B

| ID | U_ID | D_ID | S_ID | SOC | SOH |
|---|---|---|---|---|---|
| 31 | 32 | – | – | 100 | GOOD |
| 32 | – | 31 | – | 80 | GOOD |

FIG. 19C

| ID | U_ID | D_ID | S_ID | SOC | SOH |
|---|---|---|---|---|---|
| 31 | 32 | – | – | 100 | GOOD |
| 32 | 33 | 31 | – | 80 | GOOD |
| 33 | 34 | 32 | – | 80 | NG |
| 34 | 35 | 33 | – | 100 | GOOD |
| 35 | 36 | 34 | – | 80 | GOOD |
| 36 | – | 35 | – | 90 | GOOD |

FIG. 19D

| ID | U_ID | D_ID | S_ID | SOC | SOH |
|---|---|---|---|---|---|
| 31 | 32 | – | – | 100 | GOOD |
| 32 | 33 | 31 | – | 80 | GOOD |
| 33 | 34 | 32 | – | 80 | NG |
| 34 | 35 | 33 | – | 100 | GOOD |
| 35 | 36 | 34 | – | 80 | GOOD |
| 36 | – | 35 | 26 | 90 | GOOD |
| 26 | 25 | – | 36 | 90 | GOOD |
| 25 | 24 | 26 | – | 80 | NG |
| 24 | 23 | 25 | – | 100 | GOOD |
| 23 | 22 | 24 | – | 80 | GOOD |
| 22 | 21 | 23 | – | 80 | GOOD |
| 21 | – | 22 | – | 100 | GOOD |

BATTERY PACK

TECHNICAL FIELD

The present invention relates to a technology of communication of a battery pack.

BACKGROUND ART

In recent years, vehicles equipped with battery packs have become popular. Examples of such vehicles include electric assist bicycles and electric automobiles. Battery packs provided to such vehicles typically include a secondary battery, and such battery packs are charged while the vehicles are not being used. Patent Literature 1 discloses a battery pack for an electric motorcycle or an electric assist bicycle.

Further, battery packs with built-in secondary batteries are useful for making effective use of small-sized power generation facilities for household use, which may use solar power or fuel cells. For example, effective use of such a power generation facility is possible by charging a battery pack with surplus power generated when power output from the facility is greater than power consumed by a load, and by discharging the battery pack when the power output from the facility is smaller than the power consumed by the load. Such form of use eliminates the need of wasting power or reducing the output from the facility when the power output from the facility is greater than the power consumed by the load, and also reduces the amount of power that needs to be purchased from a commercial power source when the power output from the facility is smaller than the power consumed by the load. Accordingly, such form of use prevents a waste of the power output from the facility.

CITATION LIST

Patent Literature

[Patent Literature 1]
Japanese Patent Application Publication No. 2011-049151

Technical Problem

Meanwhile, the battery packs described above, in addition to being usable for supplying power to predetermined loads, are usable as vessels for transporting electricity. For example, when a disaster occurs and a blackout occurs at a certain location due to disconnection of a power distribution system of a commercial power source, transporting battery packs to the location enables use of electricity before recovery of the power distribution system. Battery packs with built-in secondary batteries are particularly useful, for being additionally chargeable during transport and during preparation for transport, and for being connectable to a predetermined load at the transport destination.

Typically, a conventional battery pack such as that disclosed in Patent Literature 1 is not designed so that a status of the battery pack, such as battery capacity and battery degradation level, is acquirable. Thus, a status of the battery pack is acquirable only when the battery pack is connected to a load.

The technology pertaining to the present disclosure aims to provide a battery pack whose status can be acquired with ease.

Solution to Problem

In order to solve the technical problem presented above, the present disclosure provides a battery pack having a housing and a secondary battery inside the housing, the battery pack characterized for including: a communicator configured to perform short-distance wireless communication with battery packs with a same structure as the battery pack; a generator configured to generate response information including information related to a status of the secondary battery in the battery pack based on a request signal that is a request for information related to the status of the secondary battery, wherein when the communicator receives the request signal from a first battery pack, the generator generates the response information based on the request signal that the communicator receives from the first battery pack; and a controller configured to cause the communicator to transmit the response information to an entity from which the communicator receives the request signal and to transmit a request signal to another battery pack, wherein when the communicator receives the request signal from the first battery pack, the another battery pack is a second battery pack differing from the first battery pack.

Advantageous Effect of Invention

The battery pack pertaining to the present disclosure, when receiving a request signal that is a request for information related to a status of a secondary battery, transmits response information including information related to the status of the secondary battery therein to an entity from which the request signal is received, and forwards the request signal to another battery pack with the same structure. This enables concurrently acquiring the status of the secondary battery from a plurality of battery packs, and thus enables checking the status of the secondary battery with ease.

BRIEF DESCRIPTION OF DRAWINGS

FIG. 12A exemplifies format of INQ message transmitted and received among battery packs 3 and portable terminal 4 pertaining to embodiment 2, FIG. 12B exemplifies format of INFO message transmitted and received among battery packs 3 and portable terminal 4 pertaining to embodiment 2, and FIG. 12C illustrates information included in INFO message transmitted and received among battery packs 3 and portable terminal 4 pertaining to embodiment 2.

FIG. 13A exemplifies communication between battery packs 3 and portable terminal 4 pertaining to embodiment 2, FIG. 13B illustrates communication paths and data in communication between battery packs 3 and portable terminal 4 pertaining to embodiment 2, and FIG. 13C exemplifies display by portable terminal 4 pertaining to embodiment 2.

FIG. 17A exemplifies format of INQ message transmitted and received among battery packs 5 and portable terminal 4 pertaining to modification of embodiment 2, FIG. 17B exemplifies format of ACK message transmitted and received among battery packs 5 and portable terminal 4 pertaining to modification of embodiment 2, FIG. 17C exemplifies format of INFO message transmitted and received among battery packs 5 and portable terminal 4 pertaining to modification of embodiment 2, FIG. 17D exemplifies format of LOOP message transmitted and received among battery packs 5 and portable terminal 4 pertaining to modification of embodiment 2, and FIG. 17E illustrates information included in INFO message transmitted and received among battery packs 5 and portable terminal 4 pertaining to modification of embodiment 2.

FIG. 19A illustrates information included in INFO message transmitted by battery pack 5 pertaining to modification of embodiment 2 with ID "31", FIG. 19B illustrates information included in INFO message transmitted by battery pack pertaining to modification of embodiment 2 with ID "32", FIG. 19C illustrates information included in INFO message transmitted by battery pack 5 pertaining to modification of embodiment 2 with ID "36", and FIG. 19D illustrates information included in INFO message received by portable terminal 4 pertaining to modification of embodiment 2.

DESCRIPTION OF EMBODIMENTS

The following explains embodiments of the present invention, with reference to the accompanying drawings.

Embodiment 1

<Structure>

Figure 1:
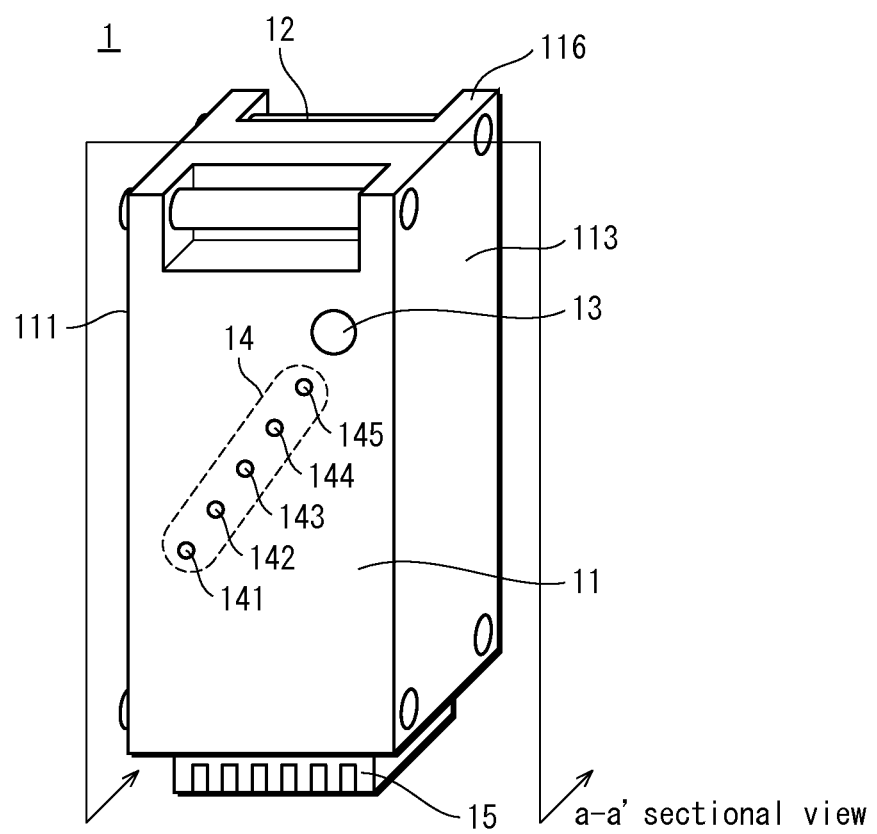
FIG. 1 illustrates the external appearance of battery pack 1 pertaining to embodiment 1.

FIG. 1 illustrates the external appearance of a battery pack 1 in embodiment 1.

The battery pack 1 has a housing 11. The housing 11 has, provided on a surface thereof, handles 12, a button 13, a display 14, and a connector holder 15.

The housing 11 has a substantially rectangular-cuboid shape. The housing 11 has six faces in total. Among the six faces, a top face and a bottom face of the battery pack 1, when stacked on another battery pack 1 in the same orientation and in aligned state, are referred to in the following as a top face 113 and a bottom face 111, respectively, for convenience of description. Further, among the six faces, a face to which the handles 12 are provided, or that is, one of two end faces of the housing 11 that does not have the connector holder 15 provided thereto, is referred to in the following as a side face 116. When the battery pack 1 is stacked on another battery pack 1 in the same orientation and in aligned state, one of the bottom face 111 and the top face 113 faces vertically-upwards, and the other one of the bottom face 111 and the top face 113 faces vertically-downwards. As already discussed above, certain faces of the housing 11 are referred to as the bottom face 111 and the top face 113 solely for convenience of description. That is, regardless of the names provided thereto, the bottom face 111 may face vertically-upwards, and the top face 113 may face vertically-downwards. Further, when a plurality of battery packs 1 are put in line without being stacked on one another, each of the battery packs 1 may be arranged such that the face with the display 14 faces vertically-upwards.

The handles 12 facilitate transport of the battery pack 1, and are provided to one of the two end faces of the housing 11.

The connector holder 15 is provided at the other one of the two end faces of the housing 11 (i.e., the end face that is not the side face 116). The connector holder 15 is an exterior portion of a connector, of the battery pack 1, that is to be connected to a load to which the battery pack 1 supplies power. The connector holder 15 is described in detail later in the present disclosure.

Figure 2:
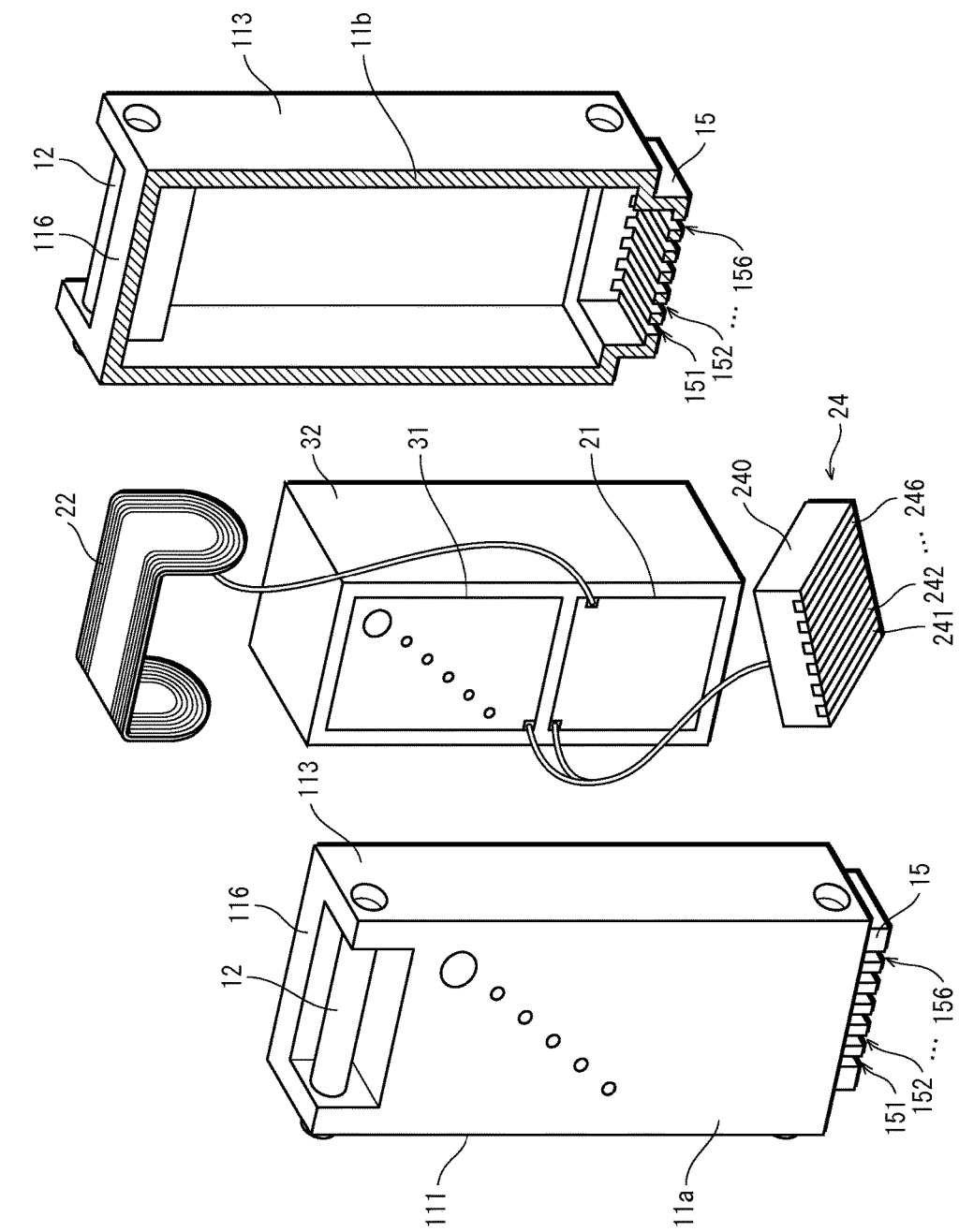
FIG. 2 illustrates the internal structure of battery pack 1 pertaining to embodiment 1.

FIG. 2 is a schematic illustrating the internal structure of the battery pack 1. The housing 11 accommodates therein a secondary battery 32, a controller 31, a connector 24, a communicator 21, and an antenna 22.

The secondary battery 32 includes a plurality of battery cells, and each battery cell is, for example, a lithium-ion battery. The secondary battery 32 is composed of a frame having a rectangular-cuboid shape and the plurality of battery cells. The battery cells are arranged in multiple rows and columns inside the frame.

The controller 31 is for charging/discharging the secondary battery 32, and is a circuitry composed of a substrate and electronic components mounted on the substrate. The controller 31 stores statuses of the secondary battery 32. One example of a status of the secondary battery 32 is the remaining battery capacity of the secondary battery 32.

The connector 24, due to being disposed inside the connector holder 15, functions as a connecter enabling the secondary battery 32 to perform power transmission/reception with a load/power charger and to transmit information such as the remaining battery capacity thereof to the load/power charger. The connector 24 includes a plurality of connector terminals (namely, connector terminals 241 through 246). The connector terminals are each fitted into one of a plurality of slits formed on one surface of a base 240 of the connector 24, which is composed of an electrically-insulative body. The pitch between the slits of the base 240 is equal to the pitch between adjacent slits of the connector holder 15 (e.g., slit 151 and slit 152). Each of the connector terminals 241 through 246 is connected to either the controller 31 or the communicator 21. The connector terminals 241 through 246 each function as a different one of: a positive terminal; a negative terminal; an information transmission terminal; an information reception terminal; a signal ground terminal (SG, standing for signal ground); and a protective ground terminal (FG, standing for frame ground).

The communicator 21 is a circuitry for responding to an inquiry received from an external device via the antenna 22 regarding the remaining battery capacity, the degradation state, etc., of the secondary battery 32. Similar to the controller 31, the communicator 21 is a circuitry composed of a substrate and electronic components mounted on the substrate.

Figure 5:
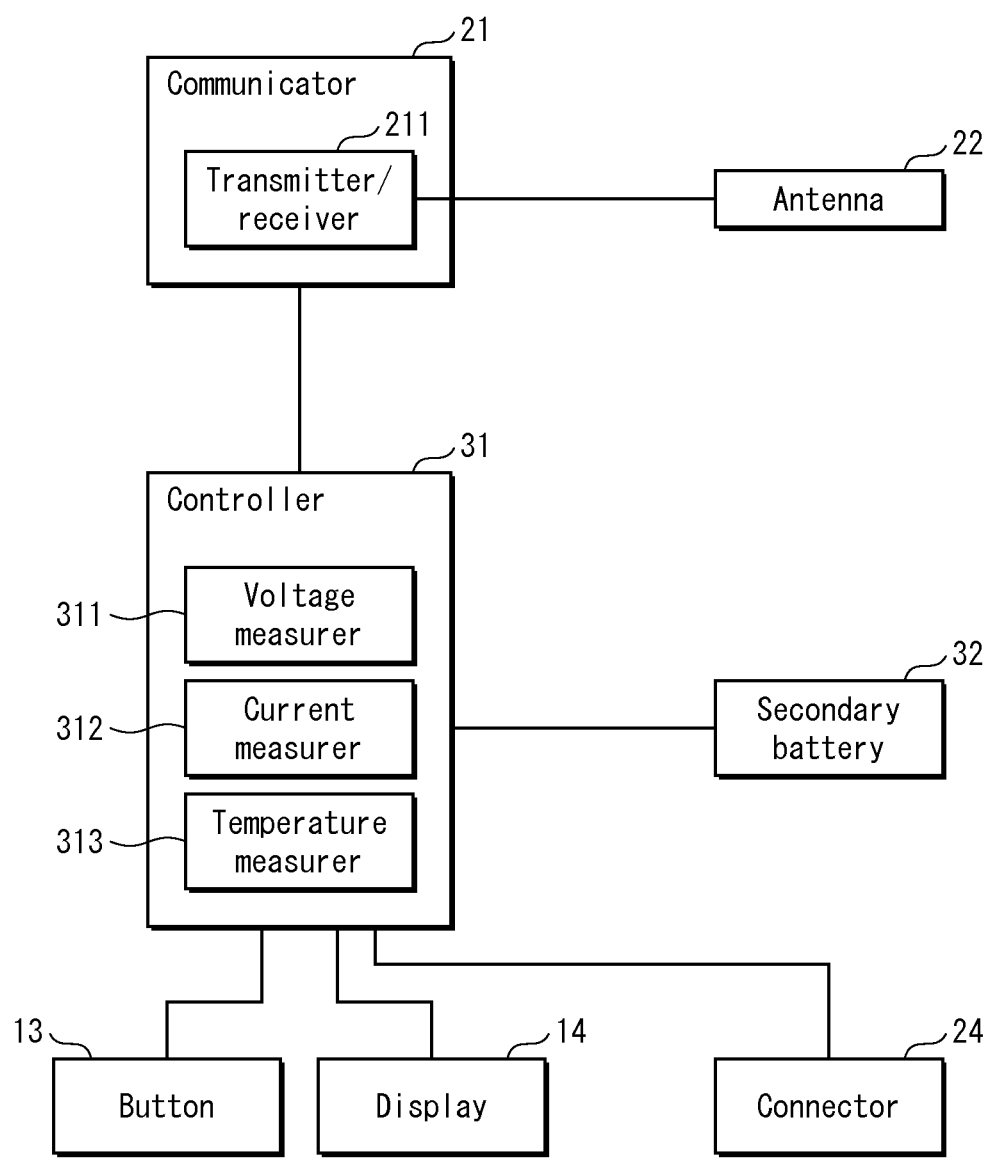
FIG. 5 is a diagram illustrating functional blocks of battery pack 1 pertaining to embodiment 1.

The antenna 22 performs short-distance wireless communication with an external device. The present embodiment takes near field communication (NFC) as one example of the short-distance wireless communication. In the present embodiment, the antenna 22 is, for example, a flexible loop antenna for wireless near field communication. FIG. 5 is a functional block diagram illustrating the antenna 22, the communicator 21, the controller 31, the secondary battery 32, and the connector 24. The functions of the respective units are described in detail later in the present disclosure.

Returning to FIG. 2, which is a schematic illustrating the internal structure of the battery pack 1, the housing 11 is composed of a housing front part 11a and a housing rear part 11b, which are connected by using screws (undepicted), for example. Each of the housing front part 11a and the housing rear part 11b is made of plastic and formed through molding. The housing 11 accommodates therein the secondary battery 32, the controller 31, the communicator 21, and the antenna 22. Further, the connector holder 15 accommodates therein the connector 24.

The controller 31 and the communicator 21 are provided to one face of the secondary battery 32, which has a rectangular-cuboid shape. A vinyl pack seals together the secondary battery 32, the controller 31, and the communicator 21. The controller 31 is located at a position such that, when the secondary battery 32 is accommodated in the housing 11, the controller 31 and combination of the button 13 and the display 14 are located immediately opposite one another with the housing 11 therebetween. The antenna 22 is adhered to an inner wall of the housing 11 to continuously cover a part of the bottom face 111, the side face 116, and a part of the top face 113.

The connector 24 is connected to the secondary battery 32 via the controller 31. The connector 24 is also connected to the communicator 21. When the connector 24 is accommodated in the connector holder 15, the slit 151 and the connector terminal 241 are at the same position. Accordingly, the connector terminal 241 can be connected with the outside of the housing 11 via the slit 151. This relationship applies to the rest of the slits of the connector holder 15 and the connector terminals of the connector 24. That is, the slit 152 and the connector terminal 242, ..., the slit 156 and the connector terminal 246 correspond to one another.

The button 13 is a controller that, when pressed, causes the battery pack 1 to display the remaining battery capacity thereof, etc. The button 13 is, for example, composed of a switch disposed on the controller 31 and a pin that is provided to the housing front part 11a.

The display 14 displays the remaining battery capacity, etc., of the battery pack 1. The display 14 is composed of five light-emitting diodes (LEDs), namely LEDs 141 through 145. Here, the LEDs 141 through 145 are provided on the controller 31, and the housing front part 11a has optical waveguides made of plastic each corresponding to a different one of the LEDs 141 through 145. The display 14 displays the remaining battery capacity, etc., of the battery pack 1 as follows. When the remaining battery capacity is lower than 20%, only the LED 141 is switched on. When the remaining battery capacity is higher than or equal to 20% but lower than 40%, the LEDs 141 and 142 are switched on. When the remaining battery capacity is higher than equal to 40% but lower than 60%, the LEDs 141, 142, and 143 are switched on, and when the remaining battery capacity is higher than equal to 60% but lower than 80%, the LEDs 141, 142, 143, and 144 are switched on. When the remaining battery capacity is higher than or equal to 80%, all of the LEDs 141 through 145 are switched on.

<Structures of Engaging Part and Engagement-Receiving Part of Housing 11>

Figure 4B:
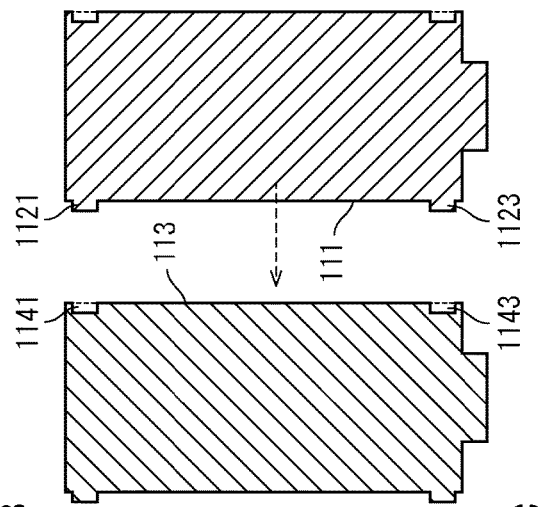
FIG. 4A exemplifies shapes of portions for connection of battery packs 1 pertaining to embodiment 1, FIG. 4B exemplifies how battery packs 1 pertaining to embodiment 1 are stacked on one another.
FIG. 4C illustrates portions for connection after battery packs 1 pertaining to embodiment 1 are stacked on one another.
Figure 4C:
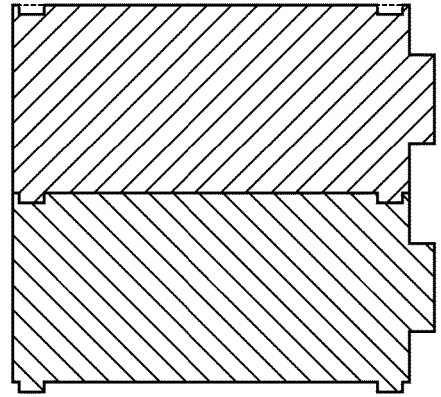
Figure 4A:
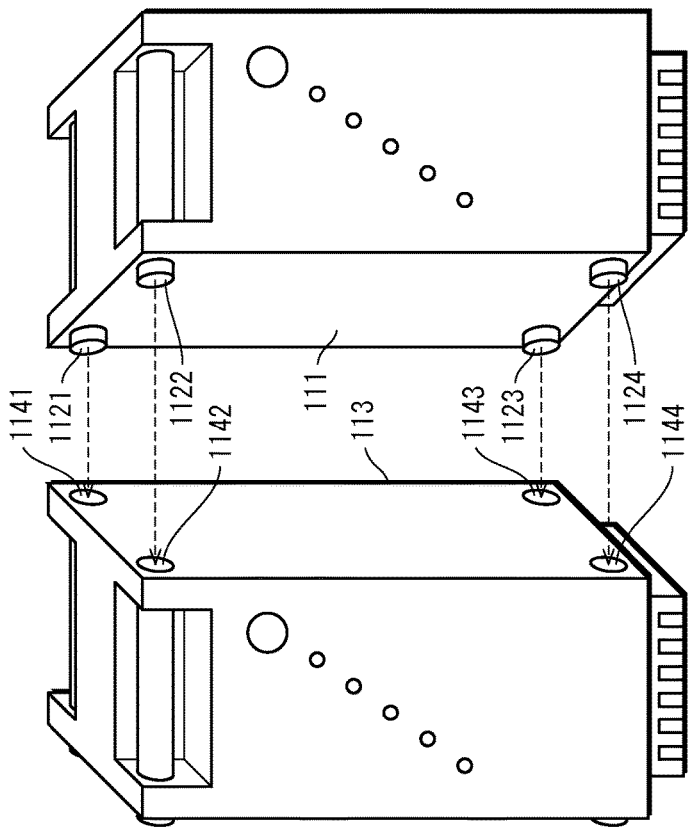

FIG. 4A illustrates the structures of an engaging part and an engagement-receiving part of the housing 11.

The bottom face 111 has, as the engagement-receiving part, projections 1121 through 1124 being cylindrical columns, each provided near one of four corners of the bottom face 111. The four projections 1121 through 1124 have the same height and the same radius.

The top face 113 has, as the engaging part, depressions 1141 through 1144 being cylindrical columns, each provided near one of four corners of the top face 113. The four depressions have the same radius as the four projections 1121 through 1124, and have a same depth that is equal to the height of the four projections 1121 through 1124. Further, in a perspective view through the housing 11 from the side of the top face 113, taken so that the top face 113 and the bottom face 111 exactly overlap with one another, the projection 1121 and the depression 1141 exactly overlap with one another. A similar positional relationship exists between the projection 1122 and the depression 1142, between the projection 1123 and the depression 1143, and between the projection 1124 and the depression 1144. Accordingly, the top face 113 and the bottom face 111 form a positive-negative relationship, one being positive and the other being negative.

Figure 3:
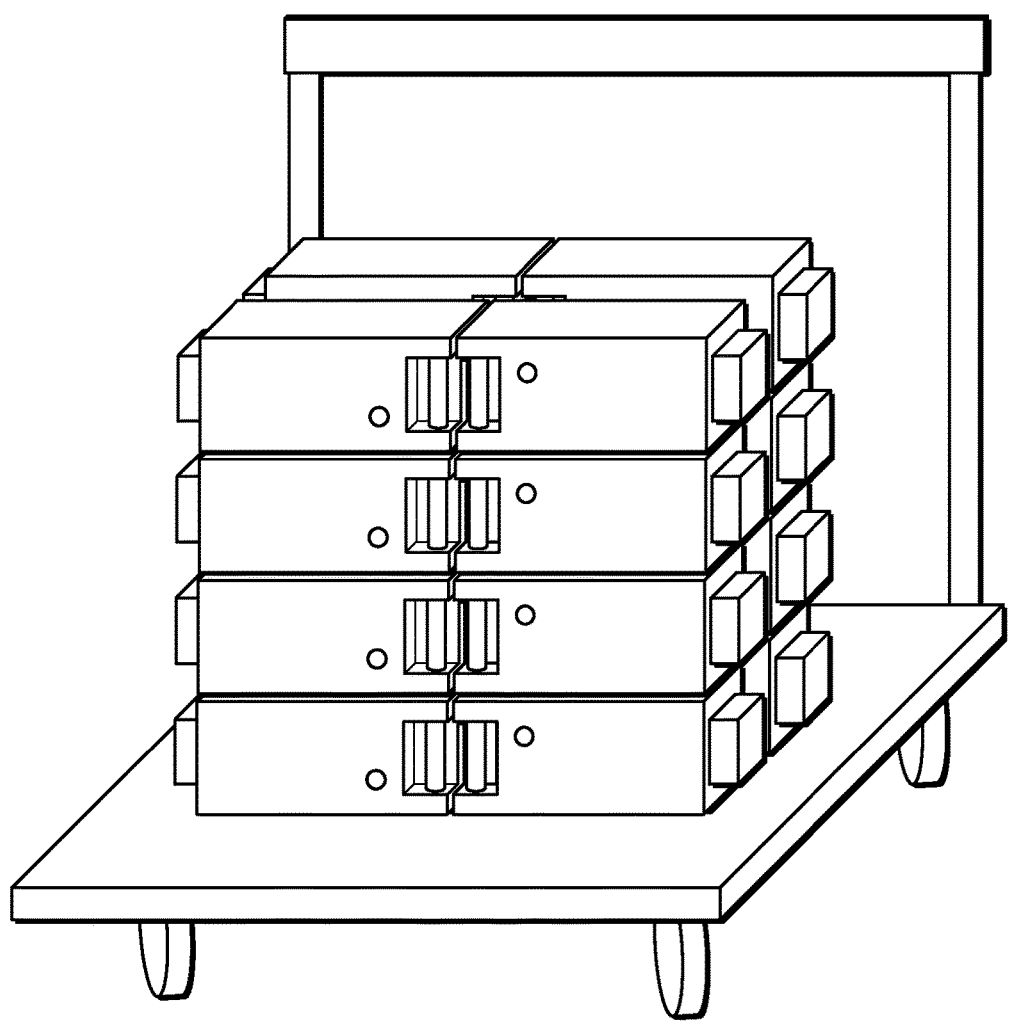
FIG. 3 exemplifies how battery packs 1 pertaining to embodiment 1 are stacked on one another.

Due to this structure, when the top face 113 of a given battery pack 1 is put in contact with the bottom face 111 of another battery pack 1 as illustrated in FIG. 4B, the projection 1121 of the other battery pack 1 engages with the depression 1141 of the given battery pack 1, the projection 1122 of the other battery pack 1 engages with the depression 1142 of the given battery pack 1, the projection 1123 of the other battery pack 1 engages with the depression 1143 of the given battery pack 1, and the projection 1124 of the other battery pack 1 engages with the depression 1144 of the given battery pack 1. This makes impossible moving only one of two battery packs 1 stacked on one another in a direction parallel to the contacting faces (i.e., the bottom face 111 and the top face 113). Accordingly, a plurality of battery packs 1 can be transported as a group with ease by stacking battery packs 1 on one another in the same orientation and so that the bottom face 111 of one battery pack 1 is in contact with the top face 113 of another battery pack 1. Due to this, a plurality of battery packs 1 can be transported with ease by stacking the battery packs 1 on one another with bottom faces 111 and top faces 113 of some battery packs 1 in contact with the floor or a push truck, as illustrated in FIG. 3. Alternatively, a plurality of battery packs 1 can be transported with ease by fixing the battery packs 1 by tying together the battery packs 1 using a rope, for example.

<Functional Structure>

FIG. 5 illustrates functional blocks of the battery pack 1.

Figure 6B:
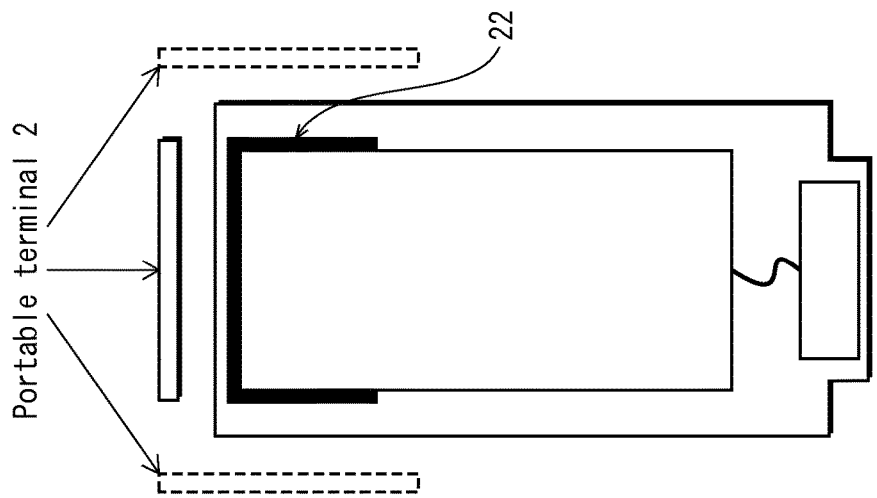
FIG. 6B illustrates the positional relationship between antenna of battery pack 1 and portable terminal 2 pertaining to embodiment 1.

The antenna 22 communicates with an external device via NFC. Here, the external device is a device that is capable of transmitting, to the battery pack 1 via NFC, an instruction message related to a status of the secondary battery 32. One example of such an external device is a portable terminal such as a smartphone. FIG. 6B is a schematic with indication of where the antenna 22 is located in a cross-section taken along arrow a-a' in FIG. 1. As already described above, the antenna 22 is disposed to continuously cover a part of the bottom face 111, the side face 116, and a part of the top face 113. Accordingly, putting a portable terminal 2 (example of an external device) in a position facing one of the bottom face 111, the side face 116, and the top face 113 enables communication between the communicator 21 and the portable terminal 2.

The communicator 21 includes a transmitter/receiver 211. The transmitter/receiver 211 retrieves a message by demodulating and decoding carriers that the antenna 22 receives. Further, the transmitter/receiver 211 generates carriers by encoding and modulating a message to be transmitted to external devices, and outputs the carriers so generated to the antenna 22. The communicator 21, by using the transmitter/receiver 211, retrieves an instruction message from carriers that the antenna 22 receives from an external device, and forwards the instruction message so received to the controller 31. Further, when receiving a message to be transmitted to an external device from the controller 31, the communicator 21 generates carriers by using the transmitter/receiver 211, and causes the antenna 22 to transmit the carriers so generated.

The controller 31 stores statuses (e.g., remaining battery capacity, degradation state) of the secondary battery 32, and executes operations based on an instruction message that the communicator 21 receives from an external device. Specifically, the controller 31, when receiving from the portable terminal 2 an instruction message that is a request for a status of the secondary battery 32, creates a response message to be transmitted to the portable terminal 2 by using the status that is requested, and transmits the created message to the communicator 21.

The following describes how the controller 31 acquires statuses of the secondary battery 32. Examples of statuses of the secondary battery 32 include, for example, the remaining battery capacity of the secondary battery 32 and the present full battery capacity of the secondary battery 32. Other examples of statuses of the secondary battery 32 include SOC (state of charge) and SOH (state of health) of the secondary battery 32, both of which can be calculated based on the remaining battery capacity and the present full battery capacity of the secondary battery 32. SOC is a ratio of the remaining battery capacity to the present full battery capacity, and SOH is a ratio of the present full battery capacity to the full battery capacity of a new secondary battery 32.

The controller 31 includes a voltage measurer 311, a current measurer 312, and a temperature measurer 313, which are usable for acquiring the statuses of the secondary battery 32. The voltage measurer 311 measures the electromotive force (EMF) of the secondary battery 32. The current measurer 312 measures a current amount discharged from the secondary battery 32 and a current amount charged to the secondary battery 32. The temperature measurer 313 measures the surface temperature of the secondary battery 32. The controller 31 calculates the present remaining battery capacity of the secondary battery 32 by, for example, performing integration on current amounts measured by the current measurer 312 with positive values for charge current and negative values for discharge current, and by adding the result of the integration to the remaining battery capacity of the secondary battery 32 before the integration, which is currently stored in the controller 31. Further, for example, the controller 31 calculates the internal impedance of the secondary battery 32 at the moment discharge of the secondary battery 32 is commenced by using, for example, (i) a difference between EMF before the commencement of discharge and EMF after the commencement of discharge, and (ii) current amount after commencement of discharge. In addition, the controller 31 estimates the present full battery capacity of the secondary battery 32 by using the internal impedance so calculated and the temperature of the secondary battery 32 at the moment discharge is commenced, based on a relationship between the inner impedance, the temperature, and the full battery capacity of the secondary battery 32, which is stored in the controller 31.

The above exemplifies how statuses of the secondary battery 32 are acquired. Statuses of the secondary battery 32 may be acquired in other ways. For example, the remaining battery capacity of the secondary battery 32 may be estimated based on EMF of the secondary battery 32, or a combination of EMF and the temperature of the secondary battery 32. In addition, for example, the remaining battery capacity value calculated through integration on current values may be corrected by using the remaining battery capacity value estimated based on EMF and the temperature of the secondary battery 32.

Further, other examples of statuses of the secondary battery 32 include EMF of the secondary battery 32, the temperature of the secondary battery 32, and the full battery capacity of a new secondary battery 32.

<Operations>

Figure 7:
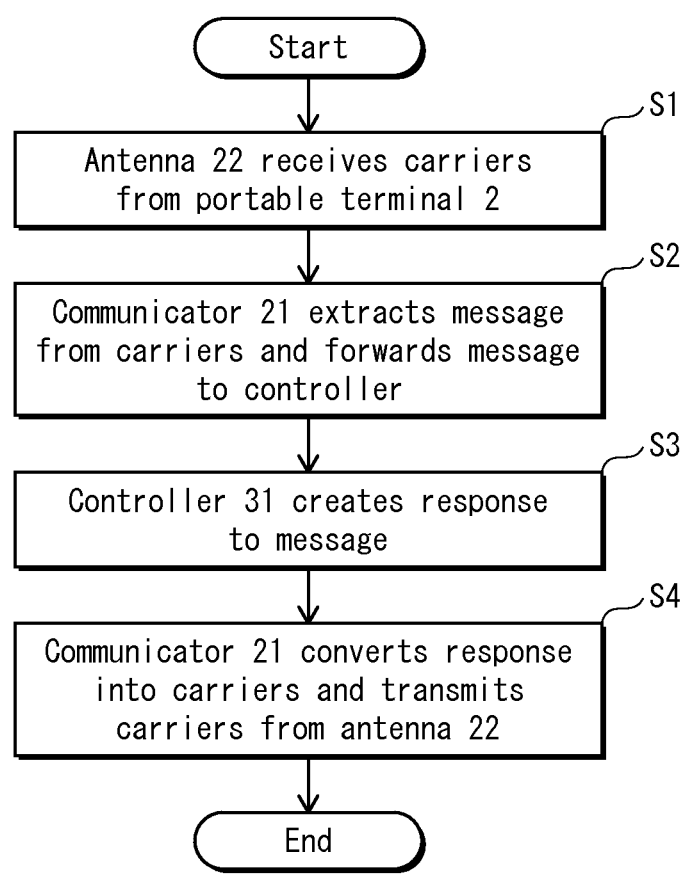
FIG. 7 is a flowchart illustrating operations of battery pack 1 pertaining to embodiment 1.

The following explains the communication between the battery pack 1 and an external device, with reference to FIG. 7.

Figure 6A:
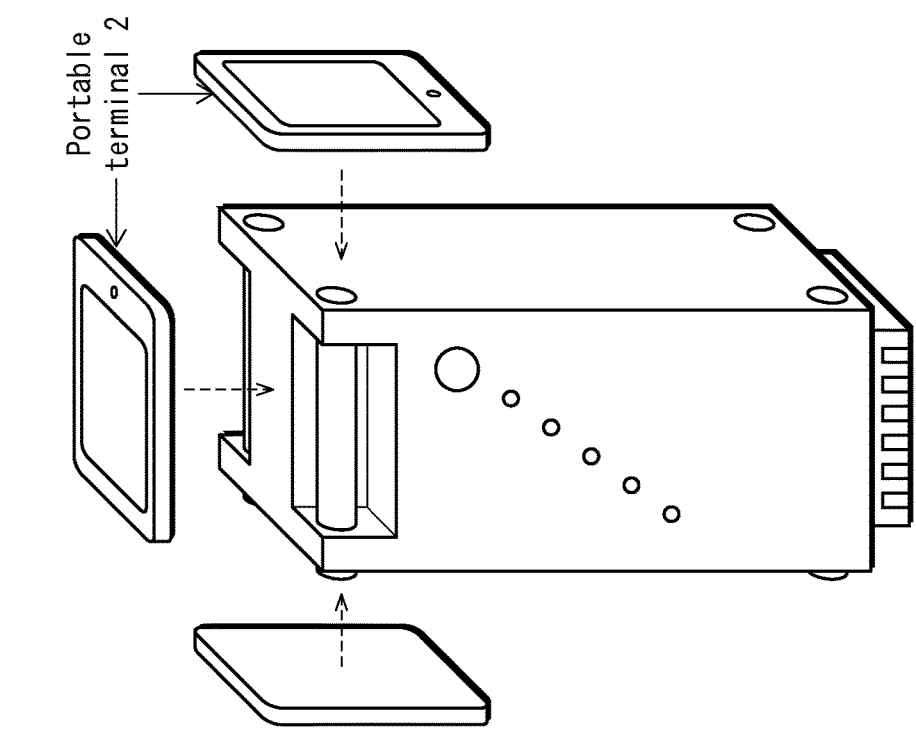
FIG. 6A illustrates an overview of communication between battery packs 1 and portable terminal 2 pertaining to embodiment 1.

The portable terminal 2, which is a smartphone for example, is taken as an example of an external device in the following. Communication is commenced when, as illustrated in FIG. 6A, the portable terminal 2 is put near the antenna 22 of the battery pack 1 and transmits an instruction message that is a request for a status of the secondary battery 32.

The portable terminal 2 generates the instruction message, and transmits carriers generated based on the instruction message to the battery pack 1. Here, for example, the instruction message is a message that is a request for the remaining battery capacity of the secondary battery 32. The antenna 22 receives the carriers transmitted by the portable terminal 2 (S1).

The communicator 21, by using the transmitter/receiver 211, retrieves the instruction message from the carriers received by the antenna 22, and transmits the instruction message to the controller 31 (S2).

The controller 31 creates a response message that is a response to the instruction message, and transmits the response message so created to the communicator 21 (S3).

Here, for example, the response message is a message indicating that the remaining battery capacity of the secondary battery 32 is 70%.

The communicator 21, by using the transmitter/receiver 211, generates carriers based on the response message, and causes the antenna 22 to transmit the carriers so generated (S4).

Through the operations described above, the portable terminal 2 acquires a status of the secondary battery 32.

Note that an instruction from an external device need not be a request for a status of the secondary battery 32, and for example, may be a request that the display 14 display the remaining battery capacity of the secondary battery 32. In this case, in Step S3, processing of switching on one or more of the LEDs 141 through 145 of the display 14 is executed, instead of the above-described operations of creating a response message and transmitting the response message so created to the communicator 21. Further, in such a case, Step S4 is not executed.

<Conclusion>

As explained above, due to the bottom face 111 and the top face 113 being configured to engage with one another, a plurality of the battery packs pertaining to the present embodiment can be transported as a group with ease.

In addition, the battery pack pertaining to the present embodiment is capable of notifying an external device of a status of the secondary battery 32 via NFC. This enables acquiring a status of the secondary battery 32 without connecting an external device to the connector holder 15. Due to this, a battery pack that is not suitable for the purpose of use at the destination to which the battery packs are to be transported can be removed before actually transporting the battery packs stacked on one another. This eliminates the need of transporting an unnecessary battery pack.

<Modification 1>

In embodiment 1, description is provided based on a structure where the bottom face 111 has, as the engagement-receiving part, the projections 1121 through 1124, and the top face 113 has, as the engaging part, the depressions 1141 through 1144. However, the engagement-receiving part and the engaging part may have the respective structures described in the following.

Figure 8B:
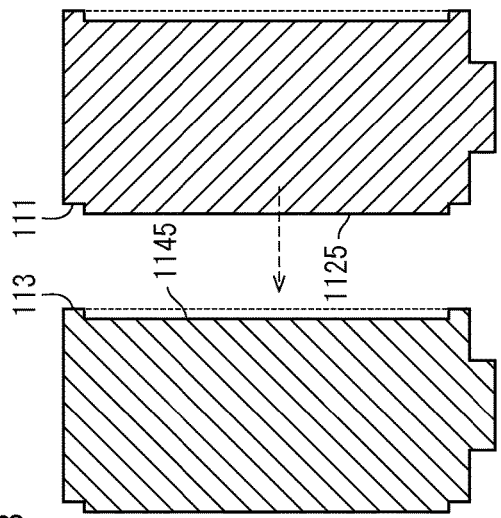
FIG. 8A exemplifies shapes of portions for connection of battery packs 1 pertaining to modification 1 of embodiment 1, FIG. 8B exemplifies how battery packs 1 pertaining to modification 1 of embodiment 1 are stacked on one another.
FIG. 8C illustrates portions for connection after battery packs 1 pertaining to modification 1 of embodiment 1 are stacked on one another.
Figure 8C:
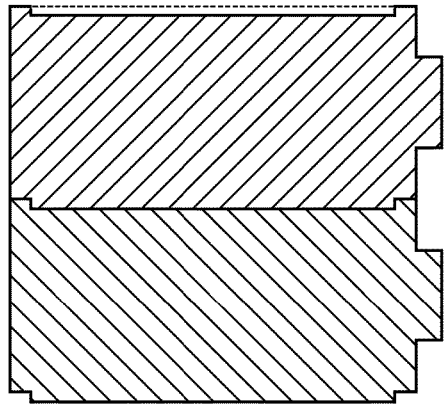
Figure 8A:
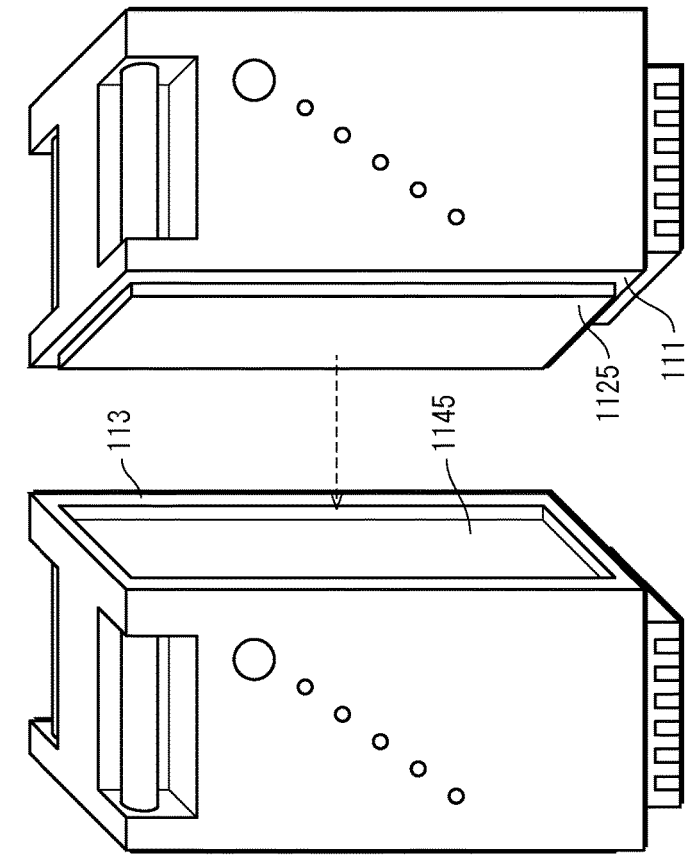

FIG. 8A illustrates the structures of the engaging part and the engagement-receiving part pertaining to the present modification.

The engagement-receiving part pertaining to the present modification is, for example, a projection 1125 being a quadrangular prism whose bottom face is a rectangular portion of the bottom face 111. In the present modification, the bottom face 111 is composed of the rectangular portion and a peripheral portion surrounding the rectangular portion.

Further, the engaging part pertaining to the present modification is a depression 1145 having the shape of a quadrangular prism. The depression 1145 has a bottom face having the same shape as the bottom face of the projection 1125. Further, the depth of the depression 1145 is equal to the height of the projection 1125. In the present embodiment, the top face 113 is composed of a depressed rectangular portion corresponding to the depression 1145 and a peripheral portion surrounding the rectangular portion. The peripheral portion of the top face 113 has the same shape as the peripheral portion of the bottom face 111.

Due to this structure, when the top face 113 of a given battery pack 1 is put in contact with the bottom face 111 of another battery pack 1 as illustrated in FIG. 8B, the projection 1125 of the other battery pack 1 engages with the depression 1145 of the given battery pack 1 as illustrated in FIG. 8C. Accordingly, the present modification achieves the same effects as embodiment 1.

<Modification 2>

Embodiment 1 and modification 1 describe structures of the engagement-receiving part and the engaging part that make completely impossible moving the battery pack 1 in the direction parallel to the contacting faces (i.e., the bottom face 111 and the top face 113).

Figure 9B:
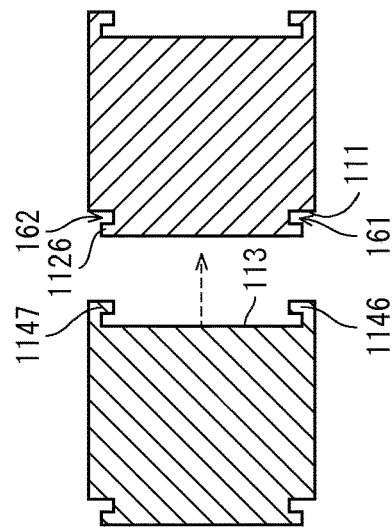
FIG. 9A exemplifies shapes of portions for connection of battery packs 1 pertaining to modification 2 of embodiment 1, FIG. 9B exemplifies how battery packs 1 pertaining to modification 2 of embodiment 1 are stacked on one another.
FIG. 9C illustrates portions for connection after battery packs 1 pertaining to modification 2 of embodiment 1 are stacked on one another.
Figure 9C:
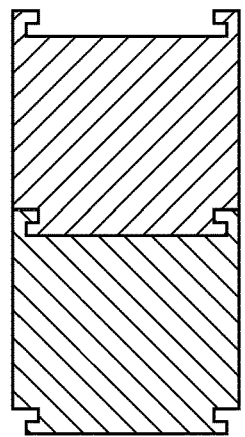
Figure 9A:
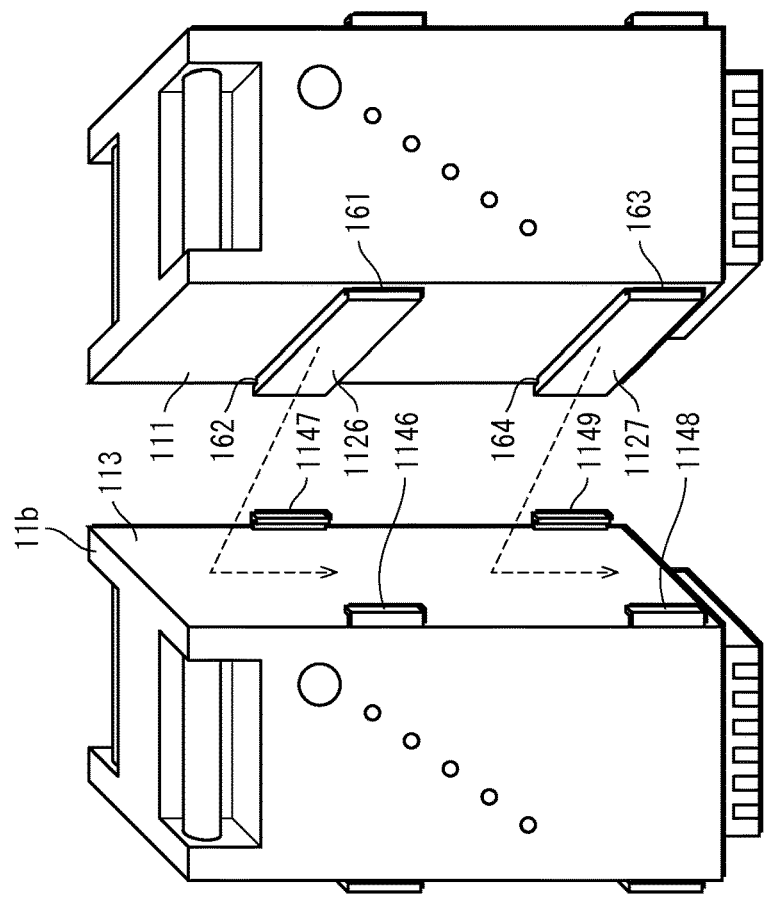

FIG. 9A illustrates the respective structures of the engaging part and the engagement-receiving part pertaining to the present modification.

The engagement-receiving part pertaining to the present modification is composed of projections 1126 and 1127. The projections 1126 and 1127 each have a thin rectangular shape. Further, each of the projections 1126 and 1127 is such that, among four sides thereof when viewed from the side of the bottom face 111, two sides that are parallel to the long sides of the bottom face 111 are each provided with a stepwise shape. Due to this, in plan view from the side face 116, each of the projections 1126 and 1127 is a combination of two rectangles one smaller than the other. In the following, the stepwise portions of the projection 1126 are referred to as stepwise portions 161 and 162. The projection 1127 also has similar stepwise portions 163 and 164.

The engaging part pertaining to the present modification is composed of claws 1146 and 1148 having the shape of the letter "L", and claws 1147 and 1149 having a shape that is an inverse of the letter "L". When a given battery pack 1 is combined with another battery pack 1 in the manner indicated by the dashed arrows in FIG. 9A, the tip of the claw 1146 of the given battery pack 1 fits into the stepwise portion 161 of the projection 1126 of the other battery pack 1, and the tip of the claw 1147 of the given battery pack 1 fits into the stepwise portion 162 of the projection 1126 of the other battery pack 1, as illustrated in FIG. 9B. Similarly, the tip of the claw 1148 of the given battery pack 1 fits into the stepwise portion 163 of the projection 1127 of the other battery pack 1, and the tip of the claw 1149 of the given battery pack 1 fits into the stepwise portion 164 of the projection 1127 of the other battery pack 1.

Thus, the bottom face 111 of the other battery pack 1 is put in engagement with the top face 113 of the given battery pack 1, as illustrated in FIG. 9C. This enables stacking a plurality of the battery packs 1 on one another while the battery packs 1 remain slidable in the longitudinal direction of the contacting faces (i.e., the bottom face 111 and the top face 113). This allows pulling out and removing any of the battery packs 1 from the group.

Embodiment 2

In embodiment 1, description is provided of a structure where a status of the secondary battery 32 is acquired separately from each battery pack 1.

Meanwhile, in the present embodiment, description is provided of a method enabling concurrently acquiring a value indicating a status (e.g., remaining battery capacity, degradation state) of the secondary battery 32 from all of a plurality of battery packs stacked on one another in the same orientation and in aligned state.

<Structure>

Figure 10:
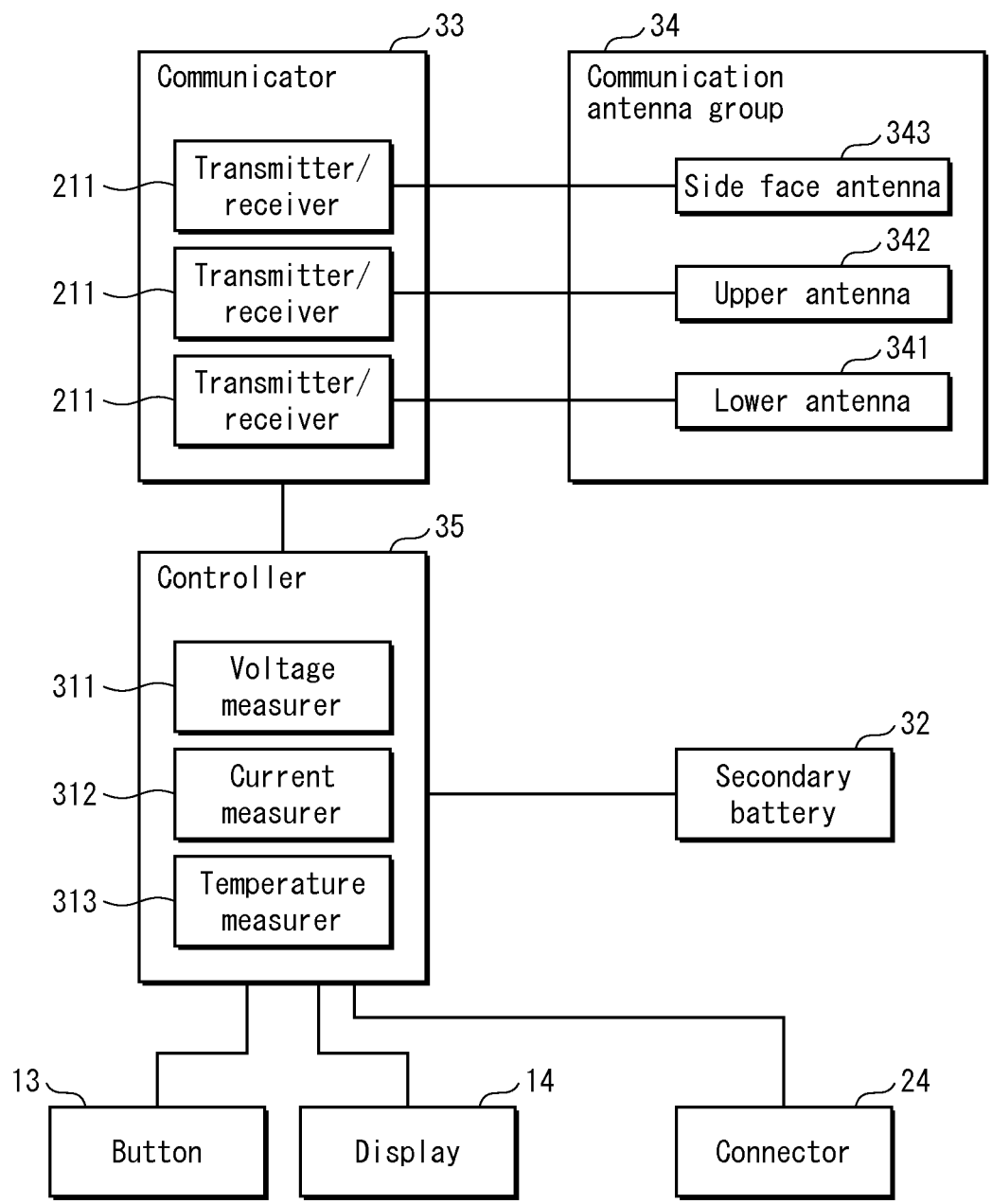
FIG. 10 is a diagram illustrating functional blocks of battery pack 3 pertaining to embodiment 2.

FIG. 10 illustrates functional blocks of a battery pack 3 pertaining to the present embodiment. In FIG. 10, functional blocks already introduced in FIG. 5 are provided with the same reference signs. Further, description of such functional blocks is not provided in the following.

The battery pack 3 pertaining to the present embodiment differs from the battery pack 1 pertaining to embodiment 1 for including a communication antenna group 34 in place of the antenna 22, for including a communicator 33 in place of the communicator 21, and for including a controller 35 in place of the controller 31. The following focuses on differences between the battery pack 3 and the battery pack 1.

As illustrated in FIG. 13B, the communication antenna group 34 is composed of a lower antenna 341 along the bottom face 111, an upper antenna 342 along the top face 113, and a side face antenna 343 along the side face 116. The lower antenna 341 is disposed so that, when the bottom face 111 of a given battery pack 3 is in engagement with the top face 113 of another battery pack 3, the lower antenna 341 of the given battery pack 3 faces the upper antenna 342 of the other battery pack 3. Similarly, the upper antenna 342 is disposed so that, when the top face 113 of a given battery pack 3 is in engagement with the bottom face 111 of another battery pack 3, the upper antenna 342 of the given battery pack 3 faces the lower antenna 341 of the other battery pack 3. Each of the lower antenna 341, the upper antenna 342, and the side face antenna 343 is a loop antenna, and is adhered to the inner wall of the housing 11.

The communicator 33 has the following functions in addition to the functions of the communicator 21. The communicator 33 has one transmitter/receiver 211 for each of the lower antenna 341, the upper antenna 342, and the side face antenna 343. Thus, when any antenna receives a message, the communicator 33 is capable of specifying the antenna (the lower antenna 341, the upper antenna 342, or the side face antenna 343) that receives the message. Further, when carriers generated based on the message are to be transmitted, the communicator 33 is capable of specifying the antenna (the lower antenna 341, the upper antenna 342, or the side face antenna 343) that is to transmit the carriers. In addition, the communicator 33 of a given battery pack 3 communicates not only with a portable terminal 4 but also with another battery pack 3 whose communication antenna group 34 faces the communication antenna group 34 of the given battery pack 3, regarding the other battery pack 3 as an external device.

The controller 35 has the following functions in addition to the functions of the controller 31. The controller 35 of each battery pack 3 is provided with a unique ID. In addition, the controller 35 of a given battery pack 3, when receiving an instruction message from the communicator 33, causes the communicator 33 to forward the instruction message to another battery pack 3. Further, the controller 35 of the given battery pack 3, when receiving a response message that is a response to the instruction message from the other battery pack 3, creates a response message by adding a status of the secondary battery 32 of the given battery pack 3 to the response message having been received, and when not receiving a response message from the other battery pack 3, creates a new response message. This is described in detail later in the present disclosure.

The portable terminal 4 is an external device having the functions of performing near field communication with one of a plurality of battery packs 3 that are connected to one another to acquire a status of the secondary battery 32 from each of the connected battery packs 3, and displaying the information so acquired. The portable terminal 4 may, for example, be a smartphone.

<Operations>

The communication pertaining to the present embodiment is commenced when the portable terminal 4 is put near one antenna of the communication antenna group 34 of a given one of battery packs 3 connected to one another, and requests for a status of the secondary battery 32.

<Operations of Given Battery Pack 3>

Figure 11:
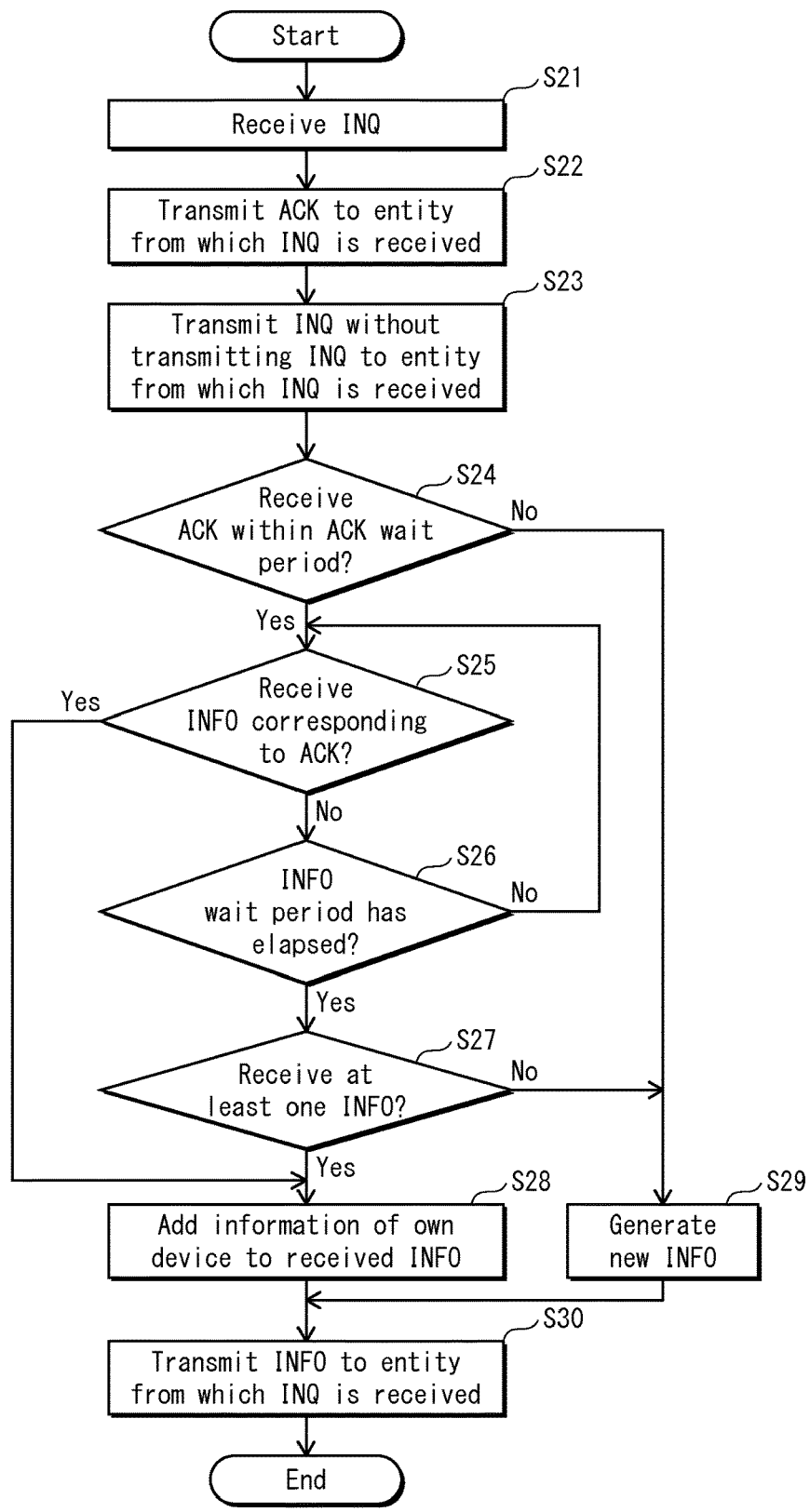
FIG. 11 is a flowchart illustrating operations of each battery pack 3 pertaining to embodiment 2.

The following describes the operations of a given battery pack 3. FIG. 11 is a flowchart illustrating the operations of a given battery pack 3.

Note that in the following, when the communicator 33 receives an INQ message via the lower antenna 341, the communicator 33 actually confirms that a message that the transmitter/receiver 211 corresponding to the lower antenna 341 retrieves from carriers that the lower antenna 341 receives is an INQ message. Similarly, when the communicator 33 transmits an ACK message via the upper antenna 342, the communicator 33 actually generates carriers from an ACK message by using the transmitter/receiver 211 corresponding to the upper antenna 342 and causes the upper antenna 342 to transmit the carriers.

The communicator 33 of a given battery pack 3 monitors whether or not any of the antennas of the communication antenna group 34 receives an INQ message from an external device.

An INQ message is a request for a value indicating a status (e.g., remaining battery capacity, degradation state) of the secondary battery 32. An INQ message contains information indicating whether or not the message is an inquiry for SOC of the secondary battery 32, and information indicating whether or not the message is an inquiry for SOH of the secondary battery 32. FIG. 12A exemplifies the format of an INQ message. In FIG. 12A, INQ 300 is a header indicating that the message is an INQ message, and REQ_SOC 311 indicates whether or not the message is an inquiry for SOC and REQ_SOH 312 indicates whether or not the message is an inquiry for SOH. For example, each of REQ_SOC 311 and REQ_SOH 312 is one bit of information.

The communicator 33, when any of the antennas of the communication antenna group 34 receives an INQ message, notifies the controller 35 of the antenna having received the INQ message, and forwards the INQ message to the controller 35 (S21). The controller 35 instructs the communicator 33 to transmit an ACK message via the antenna having received the INQ message, and the communicator 33 causes the antenna having received the INQ message to transmit an ACK message (S22). For example, when the upper antenna 342 receives the INQ message, the upper antenna 342 transmits an ACK message. An ACK message is information indicating that the battery pack 3 transmitting the ACK message has received an INQ message and that the battery pack 3 transmitting the ACK message is capable of responding.

Following this, the controller 35 instructs the communicator 21 to forward the INQ message having been received in Step S21 from at least one of the lower antenna 341 and the upper antenna 342, and the communicator 33 transmits the INQ message having been received in Step S21 as instructed by the controller 35 (S23). Here, an antenna receiving the INQ message does not forward the INQ message. Accordingly, for example, when the upper antenna 342 receives the INQ message, the lower antenna 341 transmits the INQ message. Similarly, for example, when the side face antenna 343 receives the INQ message, each of the lower antenna 341 and the upper antenna 342 transmits the INQ message.

The communicator 33 checks whether or not each antenna having transmitted the INQ message receives an ACK message within a predetermined ACK wait period from when the antenna transmitted the INQ message, and notifies the controller 35 of the result of the check (S24). The predetermined ACK wait period may, for example, be one second. This operation enables determining whether or not another battery pack 3 exists in the direction of each antenna transmitting the INQ message. This is because when another battery pack 3 exists in the direction of a given antenna transmitting the INQ message, the other battery pack 3 replies by transmitting an ACK message through the above-described operation in Step S22.

The controller 35, when notified that no ACK message has been received within the predetermined ACK wait period, determines that the given battery pack 3 is at the end of a line of battery packs 3 (No in S24). When No in Step S24, the controller 35 generates an INFO message by using the ID thereof and at least one status of the secondary battery 32 that is requested by the INQ message, among the statuses of the secondary battery 32 stored therein (S29). An INFO message includes an ID of the battery pack 3 generating the INFO message and at least one of SOC and SOH of the battery pack 3 specified by the ID. FIG. 12B exemplifies the format of an INFO message. In FIG. 12B, INFO 400 is a header indicating that the message is an INFO message. Further, an INFO message includes at least one piece of VALUE 410. Each piece of VALUE 410 is data corresponding to one battery pack 3, and includes ID 411, SOC 412, and SOH 413. SOC 412 is a percentage value indicating SOC of the secondary battery 32. SOH 413 indicates either GOOD or NG, where GOOD indicates that SOH of the secondary battery 32 is no lower than 70%, and NG (stands for unsatisfactory) indicates that SOH of the secondary battery 32 is lower than 70%. The controller 35 generates a piece of VALUE 410 by using the ID stored therein and at least one of SOC and SOH stored therein, and generates an INFO message by appending INFO 400 (i.e., a header) to the piece of VALUE 410. The controller 35 instructs the communicator 33 to transmit the INFO message so generated via the antenna having received the INQ message in S21, and the communicator 33 causes the antenna having received the INQ message in S21 to transmit the INFO message (S30).

Meanwhile, the controller 35, when detecting an ACK message in response to the INQ message having been transmitted in S23, determines that another battery pack 3 exists in the direction of the antenna receiving the ACK message (Yes in S24). When Yes in S24, the controller 35 waits until the communicator 33 receives an INFO message from the entity from which the ACK message has been received (S25). In S25, when only one antenna receives an ACK message, the controller 35 waits until the antenna having received an ACK message receives an INFO message. Meanwhile, when two antennas receive an ACK message, the controller 35 waits until both the two antennas having received an ACK message each receive an INFO message. The controller 35, when the communicator 33 has received an INFO message from all relevant antennas (Yes in S25), regenerates an INFO message by using, in addition to all INFO messages having been received, the ID stored therein and at least one of SOC and SOH requested by the INQ message (S28). Specifically, the controller 35 generates an INFO message by sequentially arranging one or more pieces of VALUE 410 and then appending INFO 400 (i.e., a header). The one or more pieces of VALUE 410 are arranged in the following order: first, each piece of VALUE 410 included in an INFO message that the lower antenna 341 has received (may or may not exist); then, a piece of VALUE 410 generated from the ID stored in the controller 35 and at least one of SOC and SOH stored in the controller 35; and finally, each piece of VALUE 410 included in an INFO message that the upper antenna 342 has received (may or may not exist). The communicator 33 causes the antenna having received the INQ message in Step S21 to transmit the INFO message generated by the controller 35 (S30).

In S25, when an antenna having received an ACK message does not receive an INFO message within a predetermined INFO wait period (e.g., within five seconds) from when the antenna received the ACK message (No in S26), the controller 35 proceeds to a subsequent process (S27) regarding that the antenna did not receive the ACK message in the first place. That is, when any INFO message has been received, the controller 35 executes Step S28 by using the INFO message having been received (Yes in S27), whereas when no INFO message has been received, the controller 35 executes Step S29 instead of Step S28 (No in S27).

<Operations of Entire Battery Pack Group>

The following describes the shape of a block formed by battery packs 3, an example of the position of the portable terminal 4, and the operations of the entire block of battery packs 3.

FIG. 12C provides a simplified illustration of information included in an INFO message. FIG. 12C illustrates an INFO message including a piece of VALUE 410 corresponding to ID "101", a piece of VALUE 410 corresponding to ID "102", and a piece of VALUE 410 corresponding to ID "103", in the stated order.

<Communication Example 1>

FIGS. 13A through 13C illustrate a case where four battery packs 3 stacked on one another in a single line compose a block, and where the portable terminal 4 acquires both SOC and SOH from all four battery packs 3 via the topmost battery pack 3. As illustrated in FIG. 13A, the portable terminal 4 communicates with the topmost battery pack 3 via the upper antenna 342 of the topmost battery pack 3. Here, as illustrated in FIG. 13B, description is provided presuming that the four battery packs 3 are provided with the IDs "1", "2", "3", and "4", from top to bottom.

Figure 14:
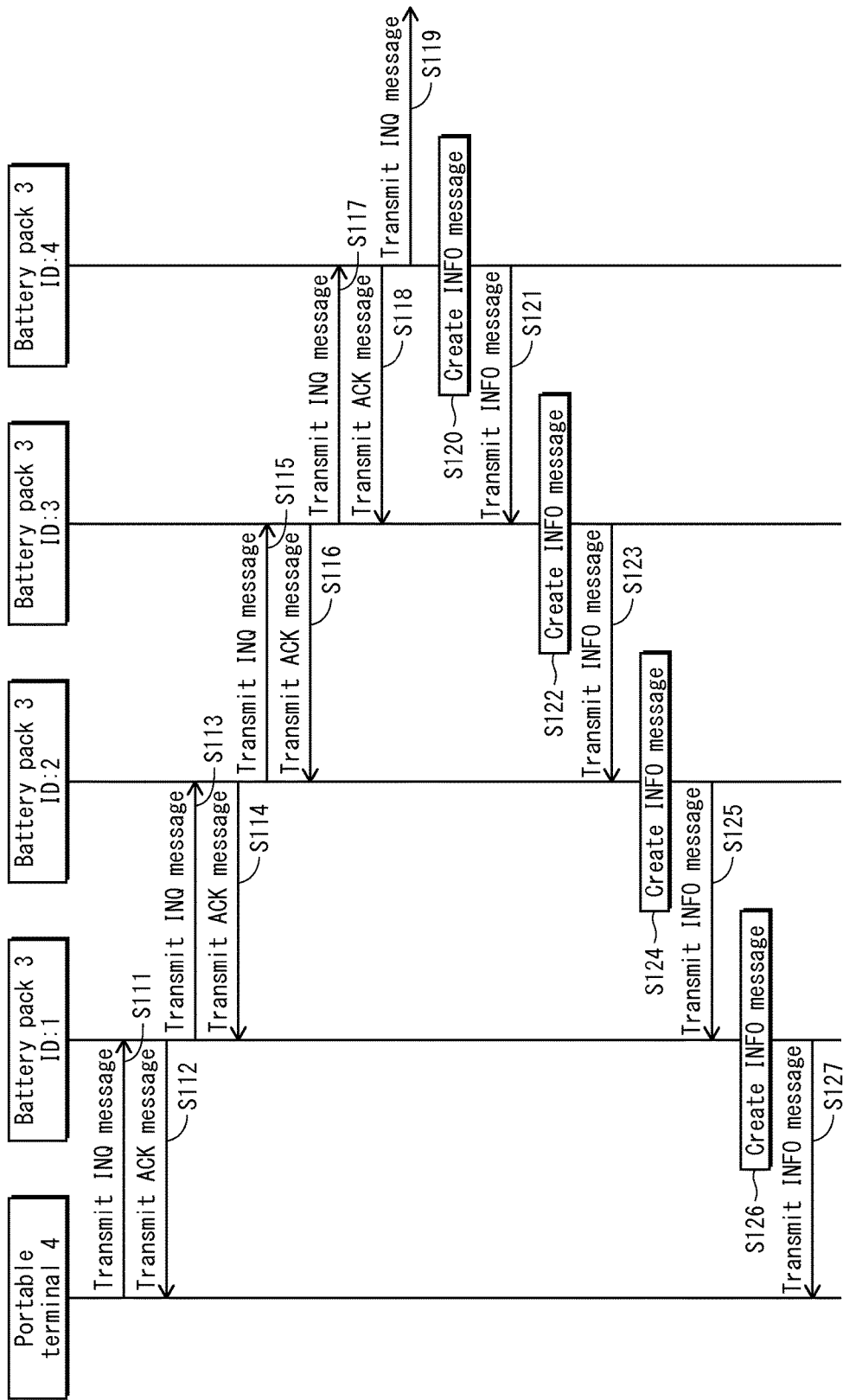
FIG. 14 is a sequential diagram illustrating overall operations in communication between battery packs 3 and portable terminal 4 pertaining to embodiment 2.

FIG. 14 illustrates a sequence of communication-related operations performed by the entire block of battery packs 3. The following description mainly refers to FIG. 14, and refers to FIG. 10 and FIGS. 13A through 13C when necessary.

First, the portable terminal 4 transmits an INQ message to the battery pack 3 with ID "1" (S111). The INQ message here is an inquiry for both SOC and SOH.

The battery pack 3 with ID "1", due to receiving the INQ message (S21), transmits an ACK message to the entity from which the INQ message has been received (S22, S112). The battery pack 3 with ID "1", due to the upper antenna 342 having received the INQ message, causes the lower antenna 341 to transmit the INQ message (S23, S113).

The battery pack 3 with ID "2", due to receiving the INQ message (S21), transmits an ACK message to the entity from which the INQ message has been received (S22, S114).

The battery pack 3 with ID "1", due to receiving the ACK message (Yes in S24), waits for the lower antenna 341 to receive an INFO message (S25). Meanwhile, the battery pack 3 with ID "2", due to the upper antenna 342 having received the INQ message, causes the lower antenna 341 to transmit the INQ message (S23, S115).

The battery pack 3 with ID "3", due to receiving the INQ message (S21), transmits an ACK message to the entity from which the INQ message has been received (S22, S116).

The battery pack 3 with ID "2", due to receiving the ACK message (Yes in S24), waits for the lower antenna 341 to receive an INFO message (S25). Meanwhile, the battery pack 3 with ID "3", due to the upper antenna 342 having received the INQ message, causes the lower antenna 341 to transmit the INQ message (S23, S117).

The battery pack 3 with ID "4", due to receiving the INQ message (S21), transmits an ACK message to the entity from which the INQ message has been received (S22, S118).

The battery pack 3 with ID "3", due to receiving the ACK message (Yes in S24), waits for the lower antenna 341 to receive an INFO message (S25). Meanwhile, the battery pack 3 with ID "4", due to the upper antenna 342 having received the INQ message, causes the lower antenna 341 to transmit the INQ message (S23, S119).

However, due to no battery pack 3 being adjacent to the bottom face 111 of the battery pack 3 with ID "4", the battery pack 3 with ID "4" does not receive an ACK message within the ACK wait time (No in S24). As such, the battery pack 3 with ID "4" detects that no battery pack 3 is adjacent to a bottom side thereof. The battery pack 3 with ID "4" generates a new INFO message 501 by using the ID, SOC, and SOH thereof (S29, S120). The battery pack 3 with ID "4" causes the upper antenna 342, which has received the INQ message, to transmit the INFO message 501 so generated (S30, S121).

The battery pack 3 with ID "3" receives the INFO message 501 from the battery pack 3 with ID "4" (Yes in S25). The battery pack 3 with ID "3", due to the lower antenna 341 receiving the INFO message 501, generates an INFO message 502 by adding a piece of VALUE composed of the ID, SOC, and SOH thereof to the tail of the INFO message 501 (S28, S122). The battery pack 3 with ID "3" causes the upper antenna 342, which has received the INQ message, to transmit the INFO message 502 so generated (S30, S123).

The battery pack 2 with ID "2" receives the INFO message 502 from the battery pack 3 with ID "3" (Yes in S25). The battery pack 3 with ID "2", due to the lower antenna 341 receiving the INFO message 502, generates an INFO message 503 by adding a piece of VALUE composed of the ID, SOC, and SOH thereof to the tail of the INFO message 502 (S28, S124). The battery pack 3 with ID "2" causes the upper antenna 342, which has received the INQ message, to transmit the INFO message 503 so generated (S30, S125).

The battery pack 3 with ID "1" receives the INFO message 503 from the battery pack 3 with ID "2" (Yes in S25). The battery pack 3 with ID "1", due to the lower antenna 341 receiving the INFO message 503, generates an INFO message 304 by adding a piece of VALUE composed of the ID, SOC, and SOH thereof to the tail of the INFO message 503 (S28, S126). The battery pack 3 with ID "1" causes the upper antenna 341, which has received the INQ message, to transmit the INFO message 504 so generated (S30, S123).

Finally, the portable terminal 4 receives the INFO message 504 from the battery pack 3 with ID "1" and displays both SOC and SOH for all battery packs 3 by using the INFO message 504. FIG. 13C exemplifies display by the portable terminal 4. The arrow 511 indicates the orientation of the side faces 116 of the battery packs 3. Graph 512 includes a bar graph indicating SOC with respect to each battery pack 3, presuming that the battery packs 3 are disposed with their top faces 113 facing vertically upwards. Further, FIG. 13C includes a cross sign (x) 513 displayed in the graph 512 at a portion corresponding to the battery pack 3 with ID "2", due to SOH of the battery pack 3 with ID "2" being unsatisfactory. Note that because the battery packs 3 in the block may be disposed with their top face 113 facing vertically-downwards, a configuration may be made such that a touch to the arrow 511 causes the arrow 511 to face the opposite direction and causes the graph 512 to be replaced with a graph including the bar graph corresponding to the battery pack 3 with ID "4" displayed at the top.

<Communication Example 2>

Figure 15A:
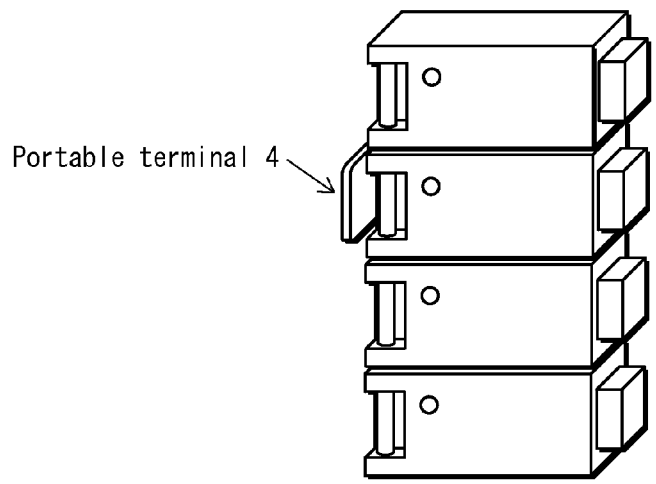
FIG. 15A exemplifies communication between battery packs 3 and portable terminal 4 pertaining to embodiment 2.
Figure 15B:
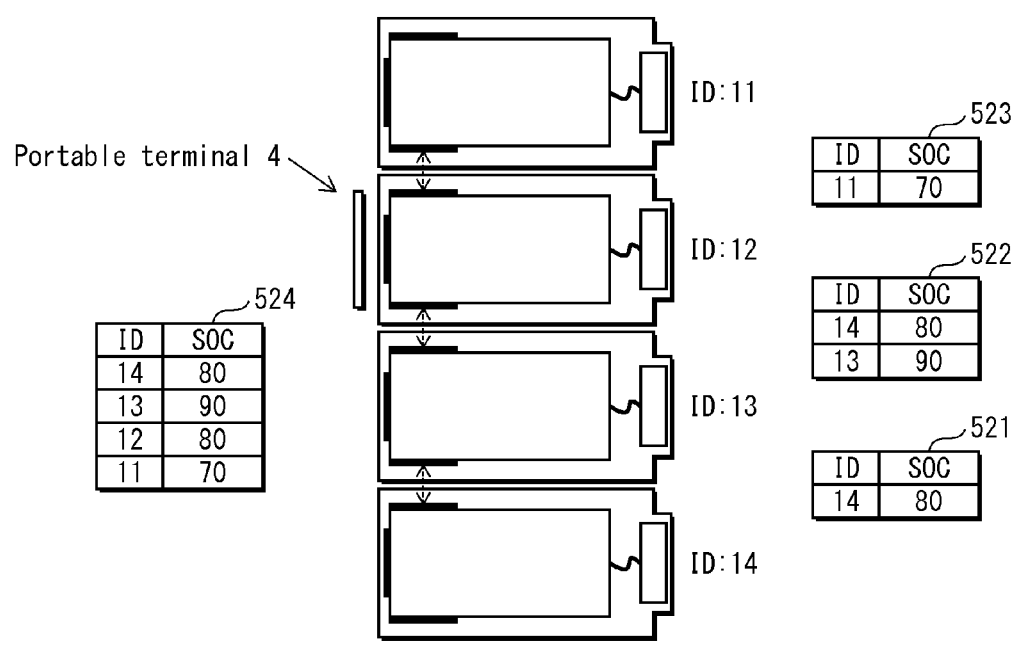
FIG. 15B illustrates communication paths and data in communication between battery packs 3 and portable terminal 4 pertaining to embodiment 2.

FIGS. 15A and 15B illustrate a case where four battery packs 3 stacked on one another in a single line compose a block, and where the portable terminal 4 acquires both SOC and SOH from all four battery packs 3 via a battery pack 3 disposed second from the top of the block. As illustrated in FIG. 15A, the portable terminal 4 communicates with the battery pack 3 disposed second from the top via the side face antenna 343 of the battery pack 3 disposed second from the top. Here, as illustrated in FIG. 15B, description is provided presuming that the four battery packs 3 are provided with the IDs "11", "12", "13", and "14", from top to bottom.

In communication example 2, battery packs 3 other than the battery pack 3 with ID "12", i.e., the battery packs 3 with IDs "11", "13", and "14" perform operations similar to those in communication example 1. Thus, the following explains only the operations of the battery pack 3 with ID "12".

The battery pack 3 with ID "12", due to receiving an INQ message (S21), transmits an ACK message to the portable terminal 4, from which the INQ message has been received (S22). The battery pack 3 with ID "12", due to the side face antenna 343 having received the INQ message, causes each of the lower antenna 342 and the upper antenna 342 to transmit the INQ message (S23).

Each of the battery pack 3 with ID "11" and the battery pack 3 with ID "13", due to receiving the INQ message (S21), transmits an ACK message to the battery pack 3 with ID "12", from which the INQ message has been received (S22).

The battery pack 3 with ID "12", due to receiving the ACK message (Yes in S24), waits for each of the lower antenna 341 and the upper antenna 342 to receive an INFO message (S25).

Description of operations from this point and on is omitted because the operations of the battery packs 3 with IDs "11" and "14" are similar to the operations of the battery pack 3 with ID "4" in Communication Example 1, and further, the operations of the battery pack 3 with ID "13" are similar to the operations of the battery pack 3 with ID "3" in Communication Example 1. The battery packs 3 with IDs "14", "13", and "11" generate INFO messages 521, 522, and 523, respectively. Note that Communication Example 2 is a case where the INQ message does not request SOH. As such, SOH 413 is null, and SOH values are not illustrated.

The lower antenna 341 of the battery pack 3 with ID "12" receives the INFO message 522 and the upper antenna 342 of the battery pack 3 with ID "12" receives the INFO message 523 (Yes in S25). The battery pack 3 with ID "12" generates an INFO message 524 by adding a piece of VALUE 410 composed of the ID and SOC thereof to the tail of a group of at least one piece of VALUE 410 included in the INFO message 522 that the lower antenna 341 has received, and by further adding to the tail a group of at least one VALUE 410 included in the INFO message 523 that the upper antenna 342 has received (S28).

Finally, the battery pack 3 with ID "12" transmits the INFO message 524 so generated to the portable terminal 4 (S30).

<Conclusion>

As explained up to this point, the battery pack pertaining to the present embodiment enables concurrently acquiring, via NFC, a status of the secondary battery 32 from all of a plurality of battery packs stacked on one another in a single line via one of the battery packs.

(Modification)

Embodiment 2 describes a method of concurrently acquiring, via NFC, a status of the secondary battery 32 from all of a plurality of battery packs stacked on one another in a single line via one of the battery packs.

The present modification describes a case where a plurality of battery packs stacked on one another in a single line compose one block, and two of such blocks are connected via side face antennas 343 of the battery packs included in the blocks. Further, the present modification describes a case where a status of the secondary battery 32 is concurrently acquired from all of the battery packs composing the two blocks.

The present modification describes a battery pack 5. The battery pack 5 is similar to the battery pack 3, differing from the battery pack 3 only in that a later-described controller is included in place of the controller 35. Thus, the following explains only the operations of the controller of the battery pack 5.

Figure 16:
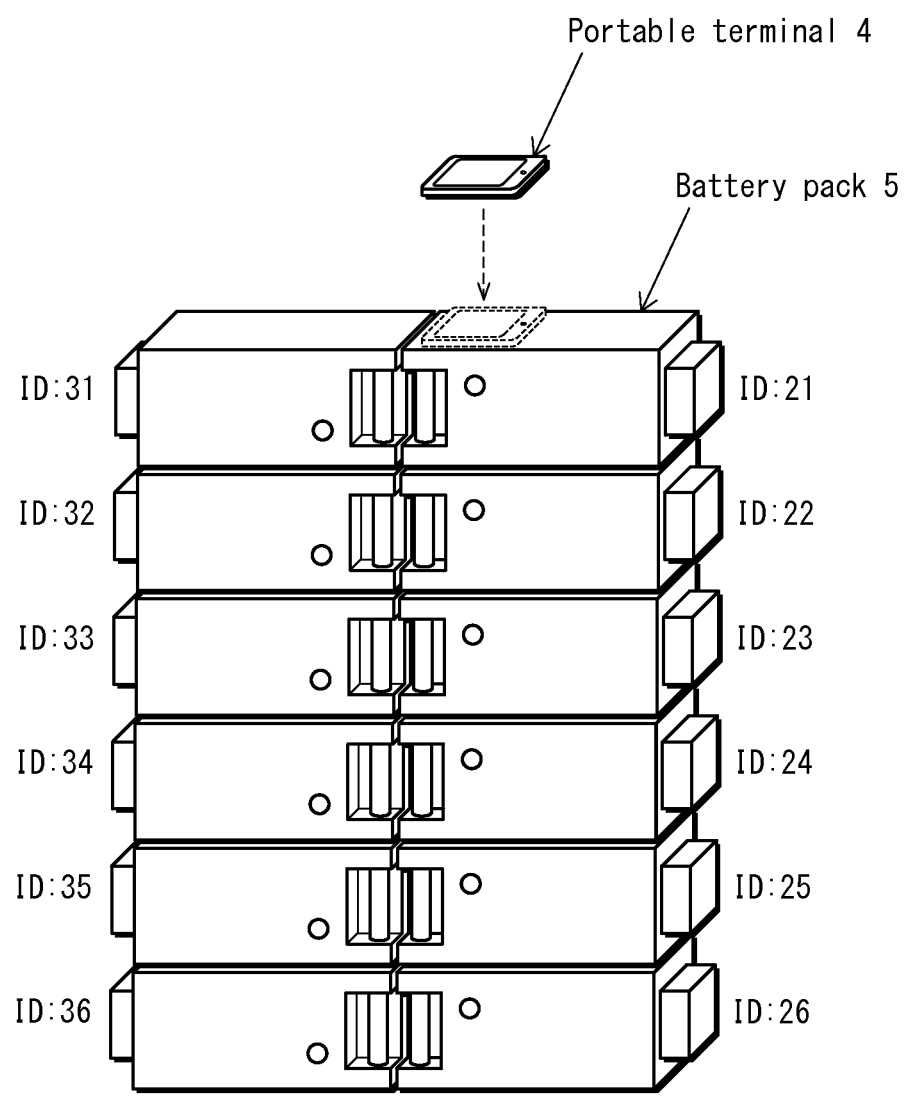
FIG. 16 illustrates an overview of communication between battery packs 5 and portable terminal 4 pertaining to modification of embodiment 2.

FIG. 16 illustrates a state where twelve battery packs 5 are stacked on one another in two lines. In the example illustrated in FIG. 16, in each line, six battery packs 5 are stacked on one another with the bottom face 111 of one battery pack 5 being connected with the top face 113 of another battery pack 5. Further, in the example illustrated in FIG. 16, side faces 116 of the battery packs 5 in the left line are put in close contact with side faces 116 of the battery packs 5 in the right line. Thus, a given battery pack 5, in addition to being able to communicate with a battery pack 5 adjacent to the bottom face 111 thereof and a battery pack 5 adjacent to the top face 113, is able to communicate with a battery pack 5 whose side face 116 is in close contact with the side face 116 thereof via the side face antenna 343. For example, the battery pack 5 with ID "23" is able to communicate with the battery pack 5 with ID "24" via the lower antenna 341, is able to communicate with the battery pack 5 with ID "22" via the upper antenna 342, and is able to communicate with the battery pack 5 with ID "33" via the side face antenna 343.

FIGS. 17A through 17E exemplify formats of various messages. As illustrated in FIG. 17A, an INQ message includes a unique INQ_ID 301. The INQ_ID 301 is generated, for example, based on the time point at which the portable terminal 4 generates the INQ message. As illustrated in FIG. 17B, an ACK message includes, in addition to ACK 600 that is a header indicating that the message is an ACK message, an INQ_ID 301 and an ID 411. The INQ_ID 301 indicates the INQ message that the ACK message corresponds to, and the ID 411 indicates the ID of the battery pack 5 that is transmitting the ACK message. As illustrated in FIG. 17C, an INFO message includes, in addition to an INQ_ID 301 indicating the INQ message that the INFO message corresponds to, pieces of VALUE 710 each including U_ID 711, D_ID 712, and S_ID 713. Each of U_ID 711, D_ID 712, and S_ID 713 indicates a position of a corresponding battery pack 5, if any. This is described in detail later in the present disclosure. Further, in the present modification, a LOOP message is used to prevent an INQ message from looping. FIG. 17D exemplifies the format of a LOOP message. A LOOP message includes LOOP 600 that is a header indicating that the message is a LOOP message, and INQ_ID 301 indicating the corresponding INQ message. This is described in detail later in the present disclosure.

<Operations>

The communication pertaining to the present modification is commenced when the portable terminal 4 is put near one antenna of the communication antenna group 34 of a given battery pack 5 among battery packs 5 connected to form two lines, and requests for a status of the secondary battery 32.

FIG. 17E provides a simplified illustration of information included in an INFO message. FIG. 17E is similar to FIG. 12C in embodiment 2.

<Operations of Given Battery Pack 5>

Figure 18:
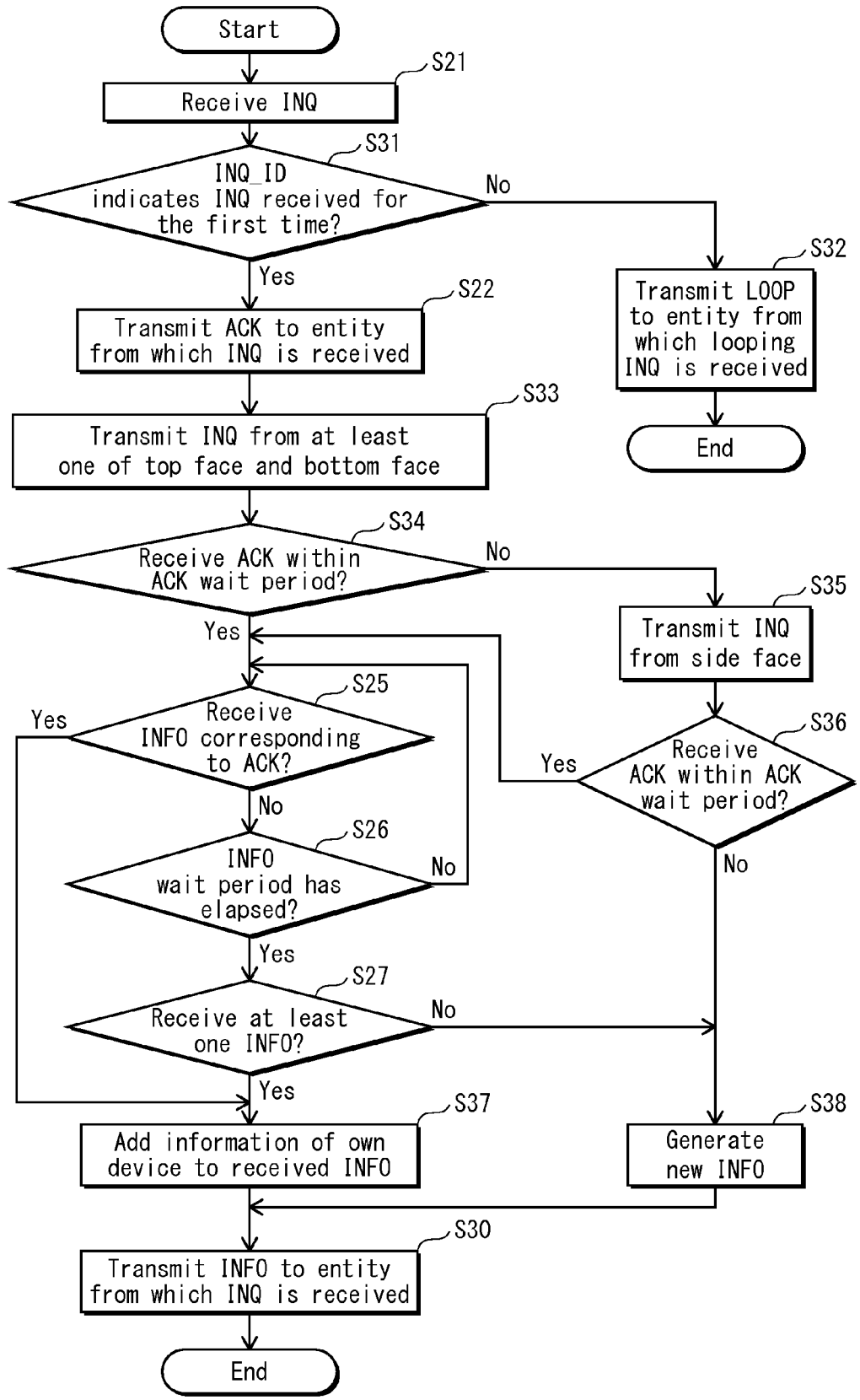
FIG. 18 is a flowchart illustrating operations of each battery pack 5 pertaining to modification of embodiment 2.

The following describes the operations of a given battery pack 5. FIG. 18 is a flowchart illustrating the operations of a given battery pack 5. In the following, operations in FIG. 18 that are included in FIG. 10 are indicated by the step numbers appended in FIG. 10, and detailed description thereof is omitted in the following.

The communicator 33 of a given battery pack 5 monitors whether or not any of the antennas of the communication antenna group 34 receives an INQ message from an external device. The communicator 33, when any of the antennas of the communication antenna group 34 receives an INQ message, forwards the INQ message to the controller and notifies the controller of the antenna having received the INQ message (S21).

The controller checks INQ_ID 301 included in the INQ message to determine whether or not the INQ message has been received for the first time (S31). Here, when the INQ message (i.e., an INQ message with the same INQ_ID 301) has been received not so long ago (e.g., within ten seconds) (No in S31), the controller determines that the INQ message is looping. Then, the controller causes the communicator 33 to transmit a LOOP message including INQ_ID 301 included in the INQ message via the antenna having received the INQ message (S32).

Meanwhile, when determining that the INQ message has been received for the first time (Yes in S31), the controller instructs the communicator 33 to transmit an ACK message via the antenna having received the INQ message, and the communicator 33 causes the antenna having received the INQ message to transmit an ACK message (S22). Further, the controller instructs the communicator 33 to forward the INQ message having been received in Step S21 via at least one of the lower antenna 341 and the upper antenna 342, and the communicator 33 causes at least one of the lower antenna 341 and the upper antenna 342 to transmit the INQ message (S33). Here, the antenna having received the INQ message does not forward the INQ message. Accordingly, for example, when the upper antenna 342 receives the INQ message, the lower antenna 341 transmits the INQ message. Similarly, for example, when the side face antenna 343 receives the INQ message, each of the lower antenna 341 and the upper antenna 342 transmits the INQ message.

The communicator 33 checks whether or not each antenna having transmitted the INQ message receives an ACK message within a predetermined ACK wait period from when the antenna transmitted the INQ message, and notifies the controller of the result of the check (S34). The predetermined ACK wait period may, for example, be one second. Here, when an antenna having transmitted the INQ message receives a LOOP message, the communicator 33 regards that the antenna has not received an ACK message. Further, when all antennas having transmitted the INQ message receive LOOP messages, the communicator 33 notifies the controller that no ACK message has been received, even if the predetermined ACK wait period has not elapsed yet. The controller, when notified of non-reception of an ACK message, determines that another battery pack 5 does not exist in the direction of the top face 113 or the bottom face 111 of the given battery pack 5, or that battery packs 5 in the direction of the top face 113/bottom face 111 of the given battery pack 5, if any, have already received the INQ message (No in S34). When making this determination, the controller instructs the communicator 33 to forward the INQ message having been received in S21 via the side face antenna 343, and the communicator 33 causes the side face antenna 343 to transmit the INQ message (S35).

The communicator 33 checks whether or not the side face antenna 343 receives an ACK message within a predetermined ACK wait period from when the side face antenna 343 transmitted the INQ message, and notifies the controller of the result of the check (S36). The predetermined ACK wait period may, for example, be one second. In Step S36, when the side face antenna 343 receives a LOOP message, the communicator 33 notifies the controller of non-reception of an ACK message, even if the predetermined ACK wait period has not elapsed yet. This is similar to Step S34.

The controller, when notified of non-reception of an ACK message, determines that another battery pack 5 does not exist in the direction of the side face 116 of the given battery pack 5 or that a battery pack 5 in the direction of the side face 116 of the given battery pack 5, if any, has already received the INQ message (No in S36). When making this determination, the controller generates an INFO message by using the ID thereof and at least one of SOC and SOF that is requested by the INQ message (S38). Specifically, the controller generates a piece of VALUE 710 by using the ID stored therein and at least one of SOC and SOH stored therein, and generates an INFO message by appending INFO 700 (i.e., a header) to the piece of VALUE 710. Here, the controller sets null values to U_ID 711, D_ID 712, S_ID 713. The controller instructs the communicator 33 to transmit the INFO message so generated via the antenna having received the INQ message in Step S21, and the communicator 33 causes the antenna having received the INQ message to transmit the INFO message (S30).

Meanwhile, the controller, when detecting in Step S23 or Step S26 an ACK message in response to the INQ message having been transmitted, determines that another battery pack 3 exists in the direction of the antenna having receiving the ACK message. When making this determination, the controller waits until the communicator 33 receives an INFO message from the entity from which the ACK message has been received (S25). The controller, when the communicator 33 has received an INFO message from all relevant antennas (Yes in S25), regenerates an INFO message by using, in addition to all INFO messages having been received, the ID stored therein and at least one of SOC and SOH requested by the INQ message (S37).

The following explains Step S37 in detail. The controller extracts each piece of VALUE 710 in each INFO message having been received, and performs supplementation of U_ID 711, D_ID 712, S_ID 713 with respect to each piece of VALUE 710 extracted. The following explains how the controller performs the supplementation. For a piece of VALUE 710 including the same ID 411 as the ACK message that the lower antenna 341 has received in Step S34, if any, the controller replaces U_ID 711 in such piece of VALUE 710 with the ID thereof. For a piece of VALUE 710 including the same ID 411 as the ACK message that the upper antenna 341 has received in Step S34, is any, the controller replaces D_ID 712 in such piece of VALUE 710 with the ID thereof. Further, for a piece of VALUE 710 including the same ID 411 as the ACK message that the side face antenna 343 has received in Step S34, if any, the controller replaces S_ID 713 in such piece of VALUE 710 with the ID thereof.

Subsequently, the controller generates a piece of VALUE 710 by using the ID stored therein, and at least one of SOC and SOH stored therein. Here, the controller sets ID 411 included in the ACK message that the lower antenna 341 has received in Step S34 to D_ID 712 in the piece of VALUE 710 when such ID 411 exists, sets ID 411 included in the ACK message that the upper antenna 342 has received in Step S34 to U_ID 711 in the piece of VALUE 710 when such ID 411 exists, and sets ID 411 included in the ACK message that the side face antenna 343 has received in Step S36 to S_ID 713 in the piece of VALUE 710 when such ID 411 exists. Meanwhile, the controller sets null to each of U_ID 711, D_ID 712, S_ID 713 in the piece of VALUE 710 for which a corresponding ID 411 does not exist.

Finally, the controller generates an INFO message by appending the piece of VALUE 710 so generated to the tail of a group of all pieces of VALUE 710 extracted from all INFO messages, with respect to which the supplementation of U_ID 711, D_ID 712, S_ID 713 has been performed, and by appending INFO 700 (i.e., a header).

The communicator 33 causes the antenna having received the INQ message in S21 to transmit the INFO message (S30).

In S25, when an antenna having received an ACK message does not receive an INFO message within a predetermined INFO wait period (e.g., within five seconds) from when the antenna received the ACK message, the controller proceeds to a subsequent process regarding that the antenna did not receive the ACK message in Step S34/S36 in the first place. This is similar to the operation in Step S25 in embodiment 2. That is, when any INFO message has been received, the controller executes Step S37 by using the INFO message having been received, whereas when no INFO message has been received, the controller executes Step S38 instead of Step S37.

<Operations of Entire Battery Pack Group>

The following describes the operations of the entire group of battery packs 5 illustrated in FIG. 16.

First, the portable terminal 4 transmits an INQ message to the battery pack 5 with ID "21". The INQ message here is an inquiry for both SOC and SOH.

The battery pack 5 with ID "21", due to receiving the INQ message (S21), determines whether or not the INQ message has been received for the first time (S31). In this example, because the INQ message has been received for the first time (Yes in S31), the battery pack 5 with ID "21" transmits an ACK message to the entity from which the INQ message has been received (S22). The battery pack 5 with ID "21", due to the upper antenna 342 having received the INQ message, transmits the INQ message from the lower antenna 341 (S33).

The battery pack 5 with ID "22", due to receiving the INQ message (S21), determines whether or not the INQ message has been received for the first time (S31).

In this example, because the INQ message has been received for the first time (Yes in S31), the battery pack 5 with ID "22" transmits an ACK message to the entity from which the INQ message has been received (S22).

The battery pack 5 with ID "21", due to receiving the ACK message (Yes in S34), waits for the lower antenna 341 to receive an INFO message (S25). Meanwhile, the battery pack 5 with ID "22", due to the upper antenna 342 having received the INQ message, transmits the INQ message from the lower antenna 341 (S33).

Following this, similar operations are repeated until the lower antenna 341 of the battery pack 5 with ID "26" waits to receive an ACK message (S34). Explanation of such operations is not provided in the following. While the battery pack 5 with ID "26" is executing Step S34, each of the battery packs 5 with IDs "21" through "25" waits for the lower antenna 341 to receive an INFO message (S25).

Because no battery pack 5 exists adjacent to the bottom face 111 of the battery pack 5 with ID "26", the lower antenna 341 of the battery pack 5 with ID "26" does not receive an ACK message within one second from the transmission of the INQ message in Step S33 (No in S34). Due to this, the battery pack 5 with ID "26" transmits the INQ message from the side face antenna 343 (S35).

The battery pack 5 with ID "36", due to receiving the INQ message (S21), determines whether or not the INQ message has been received for the first time (S31). In this example, because the INQ message has been received for the first time (Yes in S31), the battery pack 5 with ID "36" transmits an ACK message to the entity from which the INQ message has been received (S22).

The battery pack 5 with ID "26", due to receiving the ACK message (Yes in S36), waits for the side face antenna 343 to receive an INFO message (S25). Meanwhile, the battery pack 5 with ID "36", due to the side face antenna 343 having received the INQ message, transmits the INQ message from each of the lower antenna 342 and the upper antenna 342 (S33).

The battery pack 5 with ID "35", due to receiving the INQ message (S21), determines whether or not the INQ message has been received for the first time (S31). In this example, because the INQ message has been received for the first time (Yes in S31), the battery pack 5 with ID "35" transmits an ACK message to the entity from which the INQ message has been received (S22).

The battery pack 5 with ID "36", due to only the lower antenna 341 receiving an ACK message (Yes in S34), waits for the lower antenna 341 to receive an INFO message (S25). Meanwhile, the battery pack 5 with ID "35", due to the upper antenna 342 having received the INQ message, transmits the INQ message from the lower antenna 341 (S33).

Following this, similar operations are repeated until the lower antenna 341 of the battery pack 5 with ID "31" waits to receive an ACK message (S34). Explanation of such operations is not provided in the following. While the battery pack 5 with ID "31" is executing Step S34, each of the battery packs 5 with IDs "21" through "25" and IDs "32" through "36" waits for the lower antenna 341 to receive an INFO message (S25). Further, the battery pack 5 with ID "26" waits for the side face antenna 343 to receive an INFO message (S25).

Because no battery pack 5 exists adjacent to the bottom face 111 of the battery pack 5 with ID "31", the lower antenna 341 of the battery pack 5 with ID "31" does not receive an ACK message within one second from the transmission of the INQ message in Step S33 (No in S34). Due to this, the battery pack 5 with ID "31" transmits the INQ message from the side face antenna 343 (S35).

The battery pack 5 with ID "21", due to the side face antenna 343 receiving the INQ message (S21), determines whether or not the INQ message has been received for the first time (S31). Here, INQ_ID 301 included in the INQ message that the side face antenna 343 receives from the battery pack 5 with ID "31" is the same as INQ_ID 301 included in the INQ message that the upper antenna 342 has received from the portable terminal 4 (No in S31). Due to this, the battery pack 5 with ID "21" transmits a LOOP message from the side face antenna 343 (S32).

The battery pack 5 with ID "31", due to the side face antenna 343 receiving a LOOP message (No in S36), determines itself to be located at the end of the group of battery packs 5. The battery pack 5 with ID "31" generates an INFO message by using the ID, SOC, and SOH thereof (S38). FIG. 19A provides a simplified illustration of information included in the INFO message so generated. The battery pack 5 with ID "31" transmits the INFO message so generated from the upper antenna 342 (S30).

The battery pack 5 with ID "32" receives the INFO message from the battery pack 5 with ID "31" (Yes in S25). The battery pack 5 with ID "32" adds information related to itself to the INFO message received from the battery pack 5 with ID "31" (S37). First, the battery pack 5 with ID "32" extracts each piece of VALUE 710 from the INFO message received from the battery pack 5 with ID "31", and performs supplementation of U_ID 711, D_ID 712, S_ID 713. In this case, because the lower antenna 341 of the battery pack 5 with ID "32" has received an ACK message including ID "31" in Step S34, the battery pack 5 with ID "32" sets the ID thereof ("32") to U_ID 711 included in the piece of VALUE 710. Further, the battery pack 5 with ID "32" generates a piece of VALUE 710 by using the ID, SOC, and SOH thereof. Here, because the lower antenna 341 of the battery pack 5 with ID "32" has received an ACK message including ID "31" in Step S34, the battery pack 5 with ID "32" sets ID "31" to D_ID 712. FIG. 19B provides a simplified illustration of information included in the INFO message so generated. The battery pack 5 with ID "32" transmits the INFO message so generated from the upper antenna 342 (S30).

Following this, similar operations are repeated until an INFO message is received by the battery pack 5 with ID "36". FIG. 19C provides a simplified illustration of information included in an INFO message that the battery pack 5 with ID "36" generates in Step S37.

The battery pack 5 with ID "36" transmits the INFO message so generated from the side face antenna 343 (S30).

The battery pack 5 with ID "26" receives the INFO message from the battery pack 5 with ID "36" (Yes in S25). The battery pack 5 with ID "26" adds information related to itself to the INFO message received from the battery pack 5 with ID "36" (S37). Further, because the side face antenna 343 of the battery pack 5 with ID "26" has received an ACK message including ID "36" in Step S36, the battery pack 5 with ID "26" sets the ID thereof ("26") to S_ID 713 included in a piece of VALUE 710 with ID "36". Further, the battery pack 5 with ID "26" generates a piece of VALUE 710 by using the ID, SOC, and SOH thereof. Here, the battery pack 5 with ID "26" sets ID "36" to S_ID 713. The battery pack 5 with ID "26" transmits the INFO message so generated from the upper antenna 342 (S30).

Following this, similar operations are repeated until the battery pack 5 with ID "21" transmits an INFO message to the portable terminal 4 (S30). FIG. 19D provides a simplified illustration of information included in the INFO message received by the portable terminal 4.

The processing described above enables the portable terminal 4 to acquire SOC and SOH from all twelve battery packs 5.

<Example of Display>

Figure 20A:
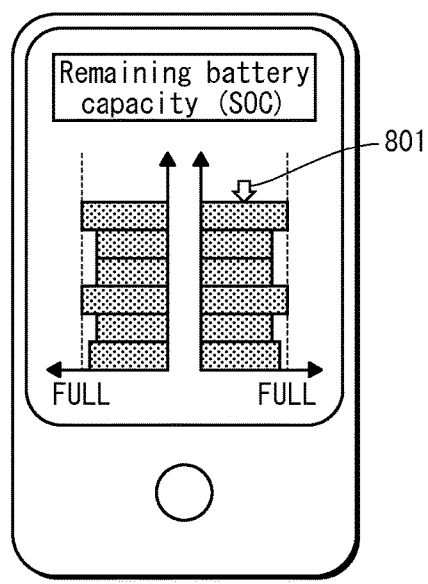
FIG. 20A exemplifies display of SOC by portable terminal 4 pertaining to modification of embodiment 2, and FIG. 20B exemplifies display of SOH by portable terminal 4 pertaining to modification of embodiment 2.
Figure 20B:
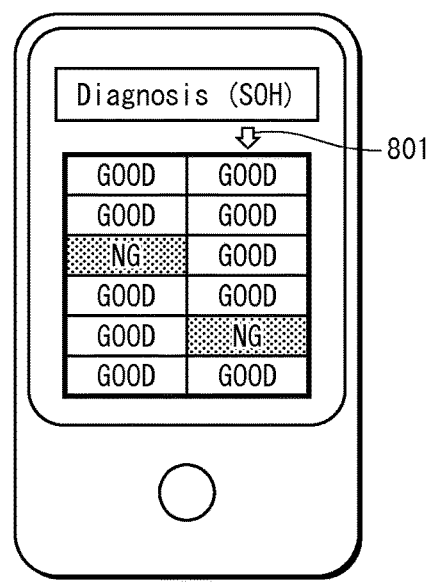

FIGS. 20A and 20B exemplify display of SOC and SOH by the portable terminal 4. FIG. 20A exemplifies display of SOC in the form of bar graphs, and FIG. 20B exemplifies display of SOH.

The following describes how the portable terminal 4 acquires the positional relationship between the battery packs 5.

First, the portable terminal 4 determines whether or not any piece of VALUE 710 included in the INFO message includes S_ID 713 with a valid value. Here, when the battery packs 5 are connected to form a single line, a piece of VALUE 710 including S_ID 713 with a valid value does not exist. Meanwhile, when the battery packs 5 are connected to form two lines, two pieces of VALUE 710 including S_ID 713 with a valid value exist.

The portable terminal 4, being able to determine the ID of the battery pack 5 adjacent thereto based on an ACK message that it has acquired, acquires a piece of VALUE 710 including the ID of the battery pack 5 adjacent thereto and refers to U_ID 711 and D_ID 712 included in the piece of VALUE 710. When either U_ID 711 or D_ID 712 includes a valid value (i.e., an ID of a battery pack 5), the portable terminal 4 acquires U_ID 711 and D_ID 712 included in a piece of VALUE 710 with an ID matching the valid value. The portable terminal 4, by repeating such processing, is able to acquire the positional relationship between battery packs 5 in a single line including the battery pack 5 adjacent thereto.

The following provides explanation with reference to the example illustrated in FIG. 19D. The portable terminal 4, due to having received an ACK message from the battery pack 5 with ID "21", determines that the battery pack 5 adjacent thereto has the ID "21". Subsequently, the portable terminal 4 refers to U_ID 711 and D_ID 712 in a piece of VALUE 710 with ID "21" for IDs of battery packs 5 located below/above the adjacent battery pack 5. In this case, because D_ID 712 in the piece of VALUE 710 with ID "21" has the value "22" while U_ID 711 in the piece of VALUE 710 with ID "21" does not have a valid value, the portable terminal 4 determines that the battery pack 5 with ID "21" is located at the upper end of a line of battery packs 5, and that the battery pack 5 with ID "22" is located immediately below the battery pack 5 with ID "21". Subsequently, because D_ID 712 in a piece of VALUE 710 with ID "22" has the value "23" and U_ID 711 in the piece of VALUE 710 with ID "22" has the value "21", the portable terminal 4 determines that the battery packs 5 with IDs "21", "22", and "23" are arranged in the stated order from the top. The portable terminal 4, by repeating such processing, is able to determine that the first line of battery packs 5 includes battery packs 5 with IDs "21", "22", "23", "24", "25", and "26" arranged in the stated order from the top.

When there exists only a single line of battery packs 5 connected together, the portable terminal 4 is able to acquire the positional relationship of all of the battery packs 5 in the single line by performing the above-described processing. Meanwhile, when there exists two lines of battery packs 5 connected together, the portable terminal 5 subsequently performs processing described in the following.

The portable terminal 4 acquires an ID corresponding to a piece of VALUE 710 whose S_ID 713 includes a valid value, from among IDs of the battery packs 5 included in the first line. The positional relationship between the battery packs 5 in the first line is already acquired as described above. The portable terminal 4, being able to determine that a side face 116 of the battery pack 5 with the ID so acquired and a side face 116 of a battery pack 5 with an ID matching the value of S_ID 713 are in contact with one another, uses the battery pack 5 with the ID matching the value of S_ID 713 as a reference for determining the arrangement of the battery packs 5 in the second line. Following this point, the portable terminal 4 acquires the arrangement of battery packs 5 in the second line through the same processing as that performed to acquire the arrangement of the battery packs 5 in the first line. That is, the portable terminal 4 acquires the value of U_ID 711/D_ID 712 in a piece of VALUE 710 with ID matching the value of S_ID 713, and repeats the processing of acquiring U_ID 711 and D_ ID 712 in a piece of VALUE 710 with ID matching the value of U_ID 711/D_ID 712. Here, when battery packs 5 are arranged as illustrated in FIG. 16 such that displays 14 of all battery packs 5 are visible, arranging battery packs 5 in the first line with the top faces 113 thereof facing vertically-upwards results in battery packs 5 in the second line being arranged with their top faces 113 facing vertically-downwards. That is, the positional relationship between the top face 113 and the bottom face 111 of a battery pack 5 at a given position in the second line is the reverse of the positional relationship between the top face 113 and the bottom face 111 of a battery pack 5 at a corresponding position in the first line. Due to this, a battery pack face at a given position determined as being a top face 113 in the determination of the arrangement of battery packs 5 in the first line is determined as being a bottom face 111 in the determination of the arrangement of battery packs 5 in the second line, and vice versa. The portable terminal 4, being able to determine the positional relationship between the first line and the second line by using S_ID 713, is able to determine the positional relationship of all battery packs 5 in the group composed of two lines.

The following description refers to the example illustrated in FIG. 19D. The portable terminal 4 acquires ID "26" whose S_ID 713 includes a valid value from among IDs "21" through "26" of battery packs 5 included in the first line. The portable terminal 4, because the value of S_ID 713 in the piece of VALUE 710 with ID "26" is "36", uses ID "36" as the reference for the second line. Following this, the portable terminal 4 determines the vertical-direction arrangement of battery packs 5 in the same manner as in the determination of the vertical-direction arrangement of battery packs 5 in the first line, but based on the reverse vertical-direction relationship. Specifically, the portable terminal 4 refers to U_ID 711 and D_ID 712 of the piece of VALUE 710 with ID "36" for IDs of battery packs 5 located above and below the battery pack 5 with ID "36". Thus, the portable terminal 4 sequentially determines the arrangement of the battery packs 5 in the second line, first determining that the battery pack 5 with ID "36" is located at the bottom end, then determining that the battery pack 5 with ID "35" is above the battery pack 5 with ID "36", and then determining that the battery pack 5 with "34" is above the battery pack 5 with ID "35", and so on. Accordingly, the portable terminal 4 is able to determine that the second line of battery packs 5 includes the battery packs with IDs "36", "35", "34", "33", "32", and "31" arranged in the stated order from the bottom.

Finally, the portable terminal 4 determines that the battery packs 5 are arranged in the arrangement illustrated in FIG. 16, based on information that the side face 116 of the battery pack 5 with ID "26" and the side face 116 of the battery pack 5 with ID "36" are in contact with one another.

In FIG. 20, the portable terminal 4 is displaying the arrangement of the battery packs 5 in the first line with the top faces 113 of the battery packs 5 facing vertically-upwards. Note that due to the portable terminal 4 not being capable of determining the orientation of the battery pack 5 with ID "21", the portable terminal 4 is displaying an arrow 801 indicating a position of the battery pack 5 with ID "21", which is adjacent to the portable terminal 4. The arrow 801 is displayed because the arrangement of the battery packs 5 being displayed may differ from the actual arrangement of the battery packs 5. That is, the displayed arrangement may be a reverse of the actual arrangement in the vertical direction, a reverse of the actual arrangement in the horizontal direction, or a reverse of the actual arrangement in both the vertical and horizontal directions. Due to this, a configuration may be made such that each time the arrow 801 is touched, the position at which the battery pack 5 adjacent to the portable terminal 4 is displayed changes, from the top left to the top right, then to the bottom right, and finally to the bottom left of the screen.

<Conclusion>

As explained up to this point, the battery pack pertaining to the present modification enables concurrently acquiring, via NFC, a value indicating a status (e.g., remaining battery capacity, degradation state) of the secondary battery 32 from all of a plurality of battery packs stacked on one another in two lines, via one of the plurality of battery packs.

Embodiment 3

In embodiment 2 and the modification thereof, explanation is provided of a method for concurrently acquiring, via NFC, a value indicating a status (e.g., remaining battery capacity, degradation state) of the secondary battery 32 from all of a plurality of battery packs (battery packs 3 or 5) stacked on one another, via one of the plurality of battery packs.

Meanwhile, the present embodiment describes transmitting, to one of a plurality of battery packs stacked on one another, an instruction causing displays of all the battery packs to display a status of the secondary battery 32, and thereby causing all the battery packs to respond to the instruction. Note that the present embodiment describes a battery pack structurally similar to the battery pack 3, differing from the battery pack 3 only for including a controller having the functions described in the following in place of the controller 35. As such, the following explanation focuses on operations pertaining to the controller.

<Instruction for Value Indicating Status of Secondary Battery>

In the present embodiment, the portable terminal 4 issues an instruction related to a status of the secondary battery 32. Specifically, the instruction causes displays 14 of all battery packs to display information corresponding to the status of the secondary battery 32. For example, the instruction may be an instruction for causing the displays 14 to display SOC in five levels, or an instruction for causing the displays 14 to display a predetermined pattern when SOH is unsatisfactory. Here, the predetermined pattern refers to the state of the display 14 when the LEDs 141, 143, and 145 are switched on while the LEDs 142 and 144 are not switched on.

<Operations of Each Battery Pack>

Figure 21:
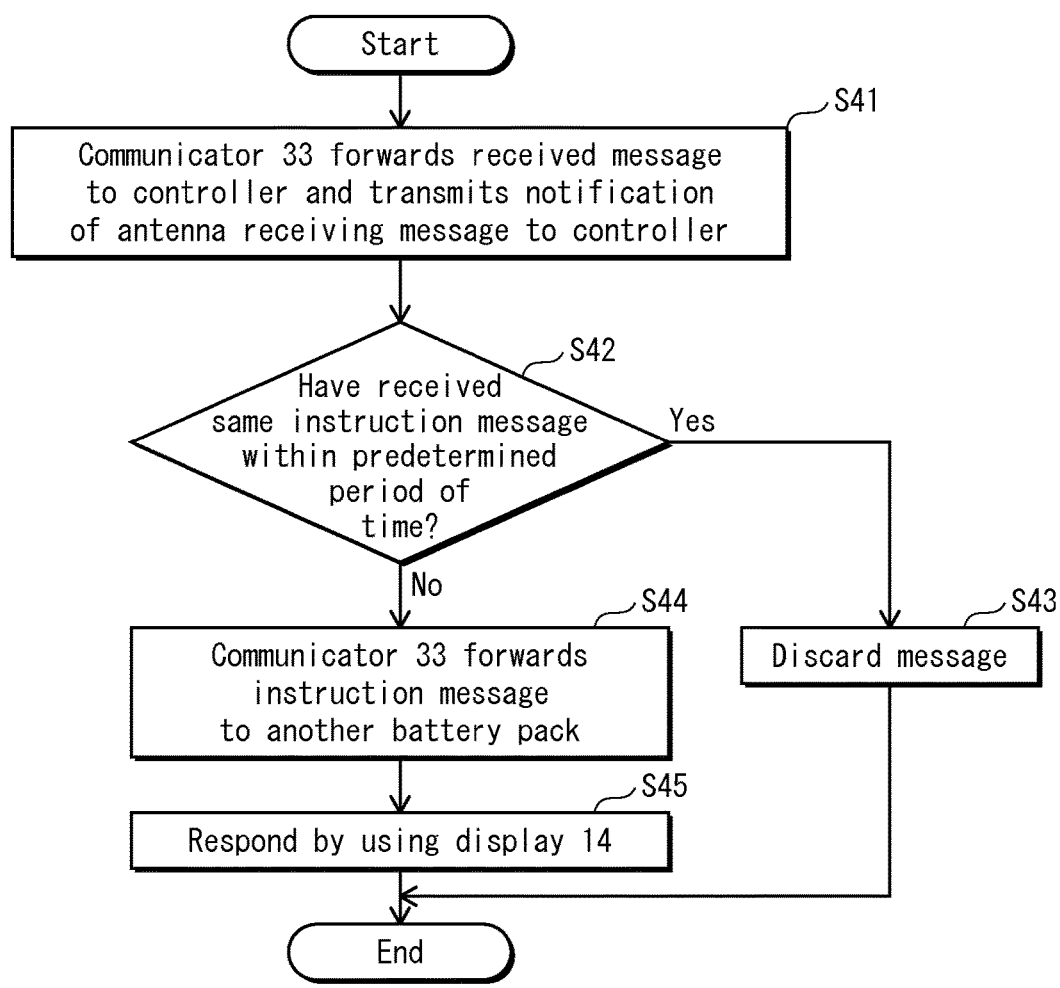
FIG. 21 is a flowchart illustrating operations of each battery pack pertaining to embodiment 3.

FIG. 21 is a flowchart illustrating operations of a given battery pack pertaining to the present embodiment.

A given battery pack, by using the communicator 33, monitors whether or not each antenna of the communication antenna group 34 receives an instruction message from an external device.

When a given antenna of the communication antenna group 34 receives an instruction message, the communicator 33 forwards the instruction message to the controller and notifies the controller of the given antenna (S41). Then, the controller determines whether or not the same instruction message has already been received at least once within a predetermined time period (S42). The predetermined time period may be, for example, ten seconds. When the same instruction message has already been received within the predetermined time period (Yes in S42), the controller discards the received instruction message and terminates processing (S43).

Meanwhile, when the instruction message has been received for the first time (No in S42), the controller instructs the communicator 33 to transmit the instruction message from all antennas other than the antenna having received the instruction message, and the communicator 33 causes such antennas to transmit the instruction message (S44). In addition, the controller responds to the instruction message by using the ID stored therein or a status of the secondary battery 32 stored therein (S45). Specifically, the controller responds to the instruction message by causing each LED included in the display 14 to switch on, to switch off, or to switch on and off.

<Operations of Entire Battery Pack Group>

The following describes the operations of the entire group of battery packs arranged in exactly the same arrangement as that illustrated in FIG. 16.

First, the portable terminal 4 transmits an instruction message to the battery pack with ID "21". Here, the instruction message is an instruction for causing the display 14 to switch on only LEDs 141, 143, 145 when SOH is unsatisfactory, and to switch off all LEDs when SOH is satisfactory.

The battery pack with ID "21" receives the instruction message (S41). The battery pack with ID "21", due to having received the instruction message for the first time (No in S42), causes each of the lower antenna 341 and the side face antenna 343 to transmit the instruction message (S44). In addition, the battery pack with ID "21" responds to the instruction message (S45). Here, SOH of the battery pack with ID "21" is satisfactory. Thus, the battery pack with ID "21" responds to the instruction message by causing the display 14 to switch off all LEDs.

The battery packs with IDs "31" and "22" each receive the instruction message as a result of the operation in Step S44 of the battery pack with ID "21" (S41). Each of the battery packs with IDs "31" and "22", due to having received the instruction message for the first time (No in S42), transmits the instruction message (S44). Here, the battery pack with ID "31" causes each of the lower antenna 341 and the upper antenna 342 to transmit the instruction message, and the battery pack with ID "22" causes each of the lower antenna 341 and the side face antenna 343 to transmit the instruction message. In addition, because SOH of each of the battery packs with IDs "31" and "22" is satisfactory, each of the battery packs with IDs "31" and "22" causes the display 14 thereof to switch off all LEDs (S45).

Then, the battery pack with ID "23" receives the instruction message as a result of the operation of the battery pack with ID "22" in Step S44 (S41). Operations of the battery pack with ID "23" following this point are similar to those of the battery pack with ID "22". Thus, explanation of such operations is not provided in the following.

Meanwhile, the battery pack with ID "32" receives two identical instruction messages as a result of the operation in Step S44 of the battery pack with ID "31" and the operation in Step S44 of the battery pack with ID "22" (S41). Receiving the two identical instruction messages, the battery pack with ID "32" performs the above-described operations in and following Step S44 with respect to one of the two instruction messages received earlier. Meanwhile, the battery pack with ID "32" discards the other one of the two instruction messages and does not perform any processing with respect to the other instruction message, regarding that the same instruction message has been received within the predetermined time period (S43). This prevents the battery pack with ID "32" from transmitting the instruction message a plurality of times to the battery pack with ID "33".

Following this point, the instruction message is forwarded from one battery pack to another by battery packs performing operations similar to those described above, until processing is terminated when the battery pack with ID "36" completes the operation in Step S45. As a result of such operations, the LEDs 141, 143, 145 of the two battery packs with IDs "25" and "33", each of which is a battery pack whose SOH is unsatisfactory, are switched on. This enables specifying ones of the battery packs whose SOH is unsatisfactory with certainty.

Note that the instruction message may include a combination of conditions. For example, the instruction message may be an instruction causing the display 14 to switch LED 143 on and off only when SOH is satisfactory and SOC has a value equal to or higher than 70%.

<Modification 1>

In embodiment 3, an instruction message is executed by all of a plurality of battery packs. However, a modification may be made such that the instruction message is transmitted only to one or more specific battery packs.

For example, this may be realized by providing the battery pack 5 pertaining to the modification of embodiment 2 with the functions of the battery pack pertaining to embodiment 3, and by causing such battery packs to execute the processing described in the following. Specifically, say the portable terminal 4 is displaying SOH of battery packs as illustrated in FIG. 20B. Here, when receiving a touch to "NG" in the third column from the top in the left row, the portable terminal 4 transmits, to the corresponding battery pack, an instruction causing one or more LEDs to switch on. In this example, the battery pack corresponding to the third column from the top in the left row is the battery pack with ID "33". Here, the battery packs 5 pertaining to the present modification perform operations similar to those of the battery packs in embodiment 3. However, battery packs 5 other than the battery pack 5 with ID "33" do not switch on any LEDs, due to the instruction being issued for the battery pack with ID "33". Meanwhile, the battery pack 5 with ID "33", due to the instruction being issued therefor, switches on one or more LEDs of the display 14. This enables associating the display by the portable terminal 4 and the battery packs 5 with certainty.

Further, a modification may be made such that each battery pack 5, when receiving an instruction issued therefor in Step S42 described above, executes only the processing in Step S45 without executing the processing in Step S44 of forwarding the instruction to other battery packs 5. This prevents forwarding of unnecessary messages.

<Modification 2>

In embodiment 3, an instruction message is issued by the portable terminal 4. However, a modification may be made such that a specific one of the battery packs generates an instruction message.

For example, a modification may be made such that one battery pack whose button 13 is continuously pressed for two seconds, in addition to causing the display 14 to display the remaining battery capacity of the secondary battery 32, creates an instruction message and causes each antenna of the communication antenna group 34 to transmit the instruction message so created, similar to Step S44 described above. Here, the instruction message is an instruction message causing each battery pack receiving the instruction message to display the remaining battery capacity of the secondary battery 32 by using the display 14.

Meanwhile, the battery packs other than the battery pack creating and transmitting the instruction message perform forwarding and executing of the instruction message, through operations similar to those described above in embodiment 3.

Such operations cause the display 14 of all battery packs in a battery pack group to display remaining battery capacity.

<Conclusion>

As explained up to this point, the battery packs pertaining to the present embodiment and the modifications thereof enable transmitting, to one of a plurality of battery packs stacked on one another in a single line, an instruction related to a value indicating a status (e.g., remaining battery capacity, degradation state) of the secondary battery 32 and thereby causing all the battery packs to concurrently display the value.

<Other Modifications Pertaining to Embodiments>

(1) In embodiment 1, the housing 11 has the shape of a substantially rectangular solid. However, the housing 11 may have other shapes. For example, the housing 11 may be such that a main part of the housing 11 that is involved in the engagement with another battery pack has the shape of a substantially rectangular solid, while other parts of the housing 11, such as the periphery of the side face 116 and the periphery of the connector holder 15, have shapes other than the shape of a substantially rectangular solid (e.g., a semispherical shape). Here, the shapes of the parts of the housing 11 other than the main part are to be determined such that such parts do not become obstacles when stacking a plurality of battery packs 1 on one another. Further, for example, the face of the housing 11 on which the display 14 is provided and the face opposite the face of the housing 11 on which the display 14 is provided may each have a curved surface.

(2) In embodiment 1, description is provided of projections that are a cylindrical columns, and in modification 1 of embodiment 1, description is provided on a projection having a prism shape. However, a projection may have other shapes. For example, a projection may have a hollow cylindrical shape. Further, a projection may have a conical or a frustum shape. When a projection has a conical or a frustum shape, a corresponding depression shall have a shape engaging with the projection. Further, when a projection has a hollow cylindrical shape, a corresponding depression may be a circular depression with the same width as the thickness of the projection, or may be a cylindrical column having a diameter equal to the external diameter of the projection.

Further, a space may exist between a depression and a projection in engagement with one another. For example, when a projection is a cylindrical column, a corresponding depression may have a radius greater than the radius of the projection. Further, when a projection is a cylindrical column, a corresponding depression may have the shape of a frustum. Making such modifications enables stacking battery packs 1 on one another without having to adjust the positions of the battery packs 1 such that a bottom face 111 of one battery pack 1 is in exact agreement with a top face 113 of another battery pack 1.

(3) In embodiment 1, four projections with the same shape are disposed each at a different one of four corners of the bottom face 111. However, the projections need not be disposed in such a manner. For example, four projections may each be disposed at any position on the bottom face 111, as long as the projections are disposed at a peripheral area of the bottom face 111. For example, four projections may be disposed each at a center of a different one of four sides of the bottom face 111. Further, the number of projections disposed need not be four, as long as at least two projections are disposed. Further, each of the bottom face 111 and the top face 113 may have both one or more projections and one or more depressions.

Further, the four projections need not have the same shapes. For example, the four projections may each have a different shape, or the shape of two projections close to the side face 116 and the shape of two projections distant from the side face 116 may differ. Alternatively, for example, the shape of the two projections close to the display 14 and the shape of the two projections distant from the display 14 may differ. Making such modifications prevents battery packs 1 from being stacked on one another with different orientations.

(4) In modification 1 of embodiment 1, the bottom face of the projection 1125 is a rectangular portion of the bottom face 111 not including a peripheral portion of the bottom face 111. However, the bottom face of the projection 1125 may have other shapes. For example, the bottom face of the projection 1125 and the depression 1126 may have a polygonal shape or an elliptical shape, as long as the bottom face is separate from an peripheral portion of the bottom face 111.

The bottom face of the projection 1125 and the depression 1126 may have a polygonal shape with an odd number of vertices. Alternatively, the bottom face of the projection 1125 and the depression 1126 need not be point-symmetrical. One example of such a case is where the bottom face of the projection 1125 has a cutaway part and the bottom face of the depression 1126 has a projecting part corresponding in shape to the cutaway part. Another example of such a case is where the bottom face of the projection 1125 has a projecting part and the bottom face of the depression 1126 has a cutaway part corresponding in shape to the projecting part. Making such modifications prevents battery packs 1 from being stacked on one another with different orientations. Further, the modification where the bottom face of the projection 1125 has a cutaway part/projecting part is not only applicable to a case where the bottom face of the projection 1125 has a polygonal shape or an elliptical shape. For example, a modification is possible where the projection 1125 is a cylindrical column and the bottom face of the projection 1125 has a cutaway part.

(5) In embodiment 1, the antenna 22 is a flexible antenna. However, the antenna 22 may be replaced with other antennas. For example, the antenna 22 may be replaced with three antennas, similar to embodiment 2. When making such a modification, the communicator 21 may have one transmitter/receiver 211 for each of the three antennas, or alternatively, may have only one transmitter/receiver 211 that is shared by the three antennas. Making such a modification prevents, when the portable terminal 2 is used to communicate with a desired one of a plurality of battery packs 1 stacked on one another, cross-talk due to antenna coupling occurring between the antenna of the desired one of the battery packs and antennas of other ones of the battery packs. Further, making such a modification enables the portable terminal 2 to continuously communicate with a plurality of battery packs 1 stacked on one another by being slid along side faces 116 of the battery packs 1.

(6) In embodiments 2 and 3, the communication antenna group 34 is composed of the lower antenna 341, the upper antenna 342, and the side face antenna 343. However, the communication antenna group need not separately include all of the lower antenna 341, the upper antenna 342, and the side face antenna 343. For example, the side face antenna 343 need not be included. Communication Example 1 in embodiment 2 is implementable without the side face antenna 343. When making such a modification, the portable terminal 4 can easily acquire the arrangement of battery packs 3 by making a modification such that, in Step S37, each battery pack 3 simply adds to the tail of an INFO message the ID thereof and at least one of SOC and SOH thereof. This is because pieces of VALUE included in an INFO message are arranged in order, with a piece of VALUE corresponding to a battery pack 3 farthest from the portable terminal 4 closest to the head and a piece of VALUE corresponding to a battery pack 3 closest to the portable terminal 4 closest to the tail. Alternatively, in Step S37, a battery pack 3 may simply add the ID thereof and a status of the secondary battery 32 to the head of an INFO message. However, in any case, the processing in Step S37 is to be the same for every battery pack 1.

Further, in Communication Example 1 in embodiment 2, the communicator 33 need not distinguish the lower antenna 341 from the upper antenna 342. When making such a modification, it suffices to make a modification similar to the modification of embodiment 2 such that a unique INQ_ID is provided to each INQ message, and in Step S21, when an INQ message having the same INQ_ID has been received not so long ago (e.g., within ten seconds), the INQ message received later is discarded. Further, it suffices to make a modification such that INFO messages that are received in Step S38, Step S30, or after completion of processing are discarded.

(7) In embodiments 1 through 3, the communicators (21/33) perform near field communication. However, the communicators may perform other forms of communication. For example, the communicator 21 may perform communication based on Bluetooth™ or ZigBee™.

Further, for example, the communicator 33 may communicate with the portable terminal 4 or communicators 33 of other battery packs 3 via, for example, the connector 24 or a dedicated communication terminal provided for such communication. For example, a terminal may be provided to each of the engaging part and the engagement-receiving part, so that when two battery packs 3 are stacked on one another, a terminal provided to the engaging part 112 of one battery pack 3 connects with a terminal provided to the engagement-receiving part 114 of the other battery pack 3.

(8) In embodiments 2 and 3, SOC and SOH are used as values indicating statuses of the secondary battery 32. However, other values indicating statuses of the secondary battery 32 may be used. For example, as values indicating statuses of the secondary battery 32, the full battery capacity of the secondary battery 32 and the current dischargeable amount of the secondary battery 32 may be used instead of values calculated therefrom. Further, as values indicating statuses of the secondary battery 32, the amount of time for which the secondary battery 32 has been used and the total amount of time the secondary battery 32 has been discharged may be used. Further, when using SOC as a value indicating a status of the secondary battery 32, SOC may be displayed in three levels, high, low, and mid. Further, when using SOH as a value indicating a status of the secondary battery 32, SOH may, instead of being indicated by using the two states of satisfactory and unsatisfactory, may be indicated by using the SOH percentage value itself. Making such modifications enables displaying information matching the characteristics of the secondary battery 32 being used.

(9) In embodiments 1 through 3, the display 14 provides indication of SOC of the secondary battery 32 by switching on only the LED 141 when SOC is lower than 20%, and additionally switching on one of the LEDs 142, 143, 144, 145 as SOH exceeds each of 20%, 40%, 60%, and 80%. However, indication of SOC need not be provided in such a manner. That is, the display 14 may provide indication of SOC in any manner. The display 14 may increase the number of LEDs 141-145 switched on as SOC increases, or for example, may switch on different ones of the LEDs 141-145 as SOC increases.

Similarly, the predetermined pattern in embodiment 3 need not be the state where the LEDs 141, 143, 145 are switched on and the LEDs 142, 144 are not switched on. As long as the predetermined pattern differs from states of the display 14 for providing indication of remaining battery capacity, any state of the display 14 achieved by switching on, switching off, and/or switching on and off specific ones of the LEDs 141-145 may be used as the predetermined pattern.

(10) In the modification of embodiment 2, each battery pack 5 generates an INFO message with a null value for U_ID 711, D_ID 712, S_ID 713 in Step S37, and supplementation of U_ID 711, D_ID 712, S_ID 713 is performed in Step S38. However, the battery packs 5 need not perform processing related to U_ID 711, D_ID 712, S_ID 713 in such a manner. For example, a modification may be made such that a battery pack transmitting a message includes the ID thereof in the INQ message transmitted in each of Step S33 and S35 and in the LOOP message generated in Step S32, and in Step S37, each battery pack 5 sets U_ID 711, D_ID 712, S_ID 713 by using the IDs included in the INQ message and the LOOP message that are received. Making such a modification eliminates the necessity of each battery pack 5 performing in Step S38 supplementation of U_ID 711, D_ID 712, S_ID 713 with respect to a received INFO message.

Alternatively, a modification may be made such that the supplementation of U_ID 711, D_ID 712, S_ID 713 with respect to a received INFO message in Step S38 is simply not performed. Such a modification is acceptable because specification of the arrangement of battery packs 5 is possible as long as a piece of VALUE 710 newly added in Step S37 includes a valid value for at least one of U_ID 711, D_ID 712, S_ID 713.

(11) In embodiment 2 and the modification of embodiment 2, each battery pack (battery pack 3 or battery pack 5) transmits an ACK message in Step S22, and in Step S25, waits for an antenna having received an ACK message to receive an INFO message. However, each battery pack may perform a different type of control.

For example, a modification may be made such that each battery pack 3 receiving the INQ message, instead of performing Steps S22 through S28, responds to the INQ message by creating an INFO message by using only the ID thereof and a status of the secondary battery 32. This is similar to the processing in Steps S29 and S38. Further, when making such a modification, each battery pack 3 receiving an INFO message from another battery pack 3 may forward the INFO message to an entity from which the INQ message has been received while adding to the INFO message information indicating that the battery pack 3 has forwarded the INFO message. Making such modifications enables a battery pack 3 located at the end of a group of battery packs 3 to respond to the INQ message by transmitting an INFO message without waiting for the ACK wait period to elapse in Steps S24, S34, and S36. Further, making such modifications enables specifying the positional relationship between battery packs 3 based on information added to the INFO message indicating that battery packs 3 have forwarded the INFO message.

Alternatively, a modification may be made, for example, such that each battery pack (battery pack 3 or battery pack 5) receiving the INQ message does not transmit an ACK message (i.e., does not execute Step S22), and further, instead of executing a combination of Steps 24 and S25 or a combination of Steps S34-36 and S25, waits for the antenna having transmitted the INQ message to receive an INFO message. When making such a modification, a transfer count indicating the number of times the INQ message has been forwarded by communicators 33 is to be stored in the INQ message in Step S23 or Step S33, and further, a shorter INFO wait period is set for a greater transfer count. Such configuration is to be made because at the time point when the battery pack (battery pack 3 or battery pack 5) at the end of the battery pack group transmits an INFO message in S30 after determining in Step S26 that the INFO wait period has elapsed, it is necessary that a battery pack adjacent to the battery pack at the end is still making a determination in S26 that the INFO wait period has not yet elapsed. Similarly, it is necessary that a battery pack 3 adjacent to the portable terminal 4 receive an INFO message from an adjacent battery pack 3 before the INFO wait period in Step S26 elapses. Making such modifications enables acquiring a status of the secondary battery 32 from a plurality of battery packs 3 without using ACK messages.

(12) In embodiment 2 and the modification of embodiment 2, the ACK wait period in Step S24, S34, and S36 is set to one second, and the INFO wait period in Step S26 is set to five seconds. However, the ACK wait period and the INFO wait period need not have such specific durations. However, it is necessary that the INFO wait period be longer than the ACK wait period, and further, that in the modification of embodiment 2, the INFO wait period be at least twice as long as the ACK wait period. Further, it is desirable that the INFO wait period be at least twice as long as the ACK wait period in embodiment 2, and the INFO wait period be at least three times as long as the ACK wait period in the modification of embodiment 2. This is because the period of time from when the battery pack 3 at the end of the battery pack group receives the INQ message in Step S21 until when the battery pack 3 at the end of the battery pack group transmits an INFO message in Step S30 may be longer than the ACK wait period in embodiment 2, and may be twice as long as the ACK wait period in the modification of embodiment 2.

(13) In the modification of embodiment 2, a LOOP message is transmitted in Step S32. However, the processing in Step S32 may differ from this. For example, a battery pack 3 may not perform any processing in Step S32. This is because, even when making such a modification, operations performed by a battery pack 3 having transmitted the INQ message are the same as the operations when not making such a modification, other than that the battery pack 3 needs to wait for the ACK wait period to elapse in Step S34 or S36.

Alternatively, a modification may be made such that a LOOP message with an ID is transmitted in Step S32. When making such a modification, the ID provided to the LOOP message may be used for processing related to U_ID, D_ID, S_ID in Step S37 or Step S38, along with IDs included in ACK messages. Making such a modification enables acquiring detailed information regarding the arrangement of battery packs 5.

(14) In embodiment 2 and the modification of embodiment 2, examples of formats of various messages such as the INQ message are exemplified. However, the messages may differ from such examples. For example, so long as the INQ message includes information indicating that the message is an inquiry of a status of the secondary battery 32 and information indicating a value or a status that the message is requesting, the INQ message may be based on any format and may include information other than the information described above. This similarly applies to other messages such as ACK messages and INFO messages. That is, such messages may be based on any format and may include any information as long as they include the information required thereto (i.e., information other than information for which null values are used).

(15) In embodiment 3, a battery pack includes the communicator 33 and the communication antenna group 34. However, the battery pack in embodiment 3 not necessarily includes the communicator 33 and the communication antenna group 34. For example, the battery pack in embodiment 3 may include, in place of the communicator 33, a communicator including one transmitter/receiver 211 that covers all antennas of the communication antenna group 34 and cannot identify one antenna from another. Alternatively, the battery pack in embodiment 3 may include, in place of the combination of the communicator 33 and the communication antenna group 34, a combination of the communicator 21 and the antenna 22. When making such modifications, the communicator does not distinguish one antenna from another, and simply causes each antenna of the communication antenna group 34 or the antenna 22 to transmit an instruction message. Such a modification may be made because a situation where one instruction message is transmitted back and forth between two battery packs does not occur. That is, if a given battery pack were to send back an instruction message to another battery pack from which the given battery pack received the instruction message in the first place, the other battery pack discards the instruction message in Step S43 after determining in Step S42 that the instruction message has already been received at least once.

(16) In embodiment 1, the connector 24 includes six connector terminals. However, the configuration of the connector 24 may differ from this. That is, the number of connector terminals that the connector 24 has need not be six, and may be five or ten, for example, as long as the connector 24 has all necessary terminals for connecting to a load or the like. Further, the number and the shape of the slits that the connector holder 15 has is not limited to those described above, provided that the number and the shape of the slits suit the number and the shape of the connector terminals. For example, the connector holder 15 may have holes instead of slits. Alternatively, for example, the connector holder 15 may have, instead of slits each corresponding to one of the connector terminals, one or more elongated holes that each corresponding to a plurality of connector terminals.

(17) In embodiments 1 through 3 and the modifications of the embodiments, the secondary battery 32 is a lithium-ion battery. However, the secondary battery 32 need not be a lithium-ion battery. The secondary battery 32 may be any other type of secondary battery such as a nickel-metal hydride battery or a lead-acid battery.

(18) In embodiments 2 and 3 and the modifications of embodiments 2 and 3, reference is made to the housing 11 in embodiment 1. However, the housing 11 is not always necessary. For example, a housing enabling the bottom surface 111 of one battery pack (battery pack 3 or battery pack 5) to engage with the top surface 113 of another battery pack is not always necessary. That is, the housing may have any structure provided that when battery packs (battery packs 3 or battery packs 5) are disposed in the same orientation and are in aligned state, the bottom surface 111 of one battery pack faces the top surface 113 of another battery pack and thus, the lower antenna 341 of the one battery pack faces the upper antenna 342 of the other battery pack. For example, a modification may be made such that a plurality of battery packs 3 are accommodated in a case provided for the purpose of transporting the battery packs 3, and ones of the battery packs 3 that are adjacent in the case are capable of communicating with each other.

In connection with this, the housing 11 in embodiment 1 need not enable the bottom face 111 of a given battery pack to engage with the top face 113 of another battery pack. Such a modification is possible because the portable terminal 2 is able to acquire a status of the secondary battery 32 as long as the portable terminal 2 can be placed to face the antenna 22.

(19) The embodiments and the modifications of the embodiments provide mere examples of the technology pertaining to the present disclosure. Thus, various improvements and modifications may be made without departing from the spirit and the scope of the present disclosure.

(Supplement)

The following explains structures and effects of various aspects of the battery pack pertaining to the present disclosure.

(1) A battery pack pertaining to one aspect of the present disclosure is characterized for including: a communicator configured to perform short-distance wireless communication with battery packs with a same structure as the battery pack; a generator configured to generate response information including information related to a status of the secondary battery in the battery pack based on a request signal that is a request for information related to the status of the secondary battery, wherein when the communicator receives the request signal from a first battery pack, the generator generates the response information based on the request signal that the communicator receives from the first battery pack; and a controller configured to cause the communicator to transmit the response information to an entity from which the communicator receives the request signal and to transmit a request signal to another battery pack, wherein when the communicator receives the request signal from the first battery pack, the another battery pack is a second battery pack differing from the first battery pack.

In this structure, a request signal that is a request for a status of the secondary battery is transmitted from one battery pack to another among a plurality of battery packs having the same structure, and further, a battery pack receiving the request signal transmits response information including information related to the status of the secondary battery to the entity from which the request signal is received. Accordingly, this structure enables concurrently acquiring the status of the secondary battery from a plurality of battery packs, and thus enables checking the status of the secondary battery with ease.

(2) In the battery pack pertaining to (1), the request signal that the communicator receives from the first battery pack may be equivalent to the request signal that the communicator transmits to the second battery pack.

This structure enables concurrently acquiring specific information related to the secondary battery from a plurality of battery packs. Accordingly, this structure enables comparing with ease the status of the secondary battery of one battery pack with the status of the secondary battery of another battery pack.

(3) In the battery pack pertaining to (1), when the communicator receives, from the second battery pack, response information that is based on the request signal that the communicator transmits to the second battery pack, the generator may generate the response information by adding information related to the status of the secondary battery in the battery pack to the response information that the communicator receives from the second battery pack.

This structure enables concurrently acquiring information including response information for each of a plurality of battery packs. Accordingly, this structure achieves effective communication between battery packs.

(4) In the battery pack pertaining to (1), the communicator may be further configured to perform the short-distance wireless communication with a communication terminal having a display, and when the communicator receives the request signal from the communication terminal, the generator may generate the response information based on the request signal, which the communicator receives from the communication terminal.

This structure enables checking the status of the secondary battery of a battery pack by using an external communication terminal.

(5) In the battery pack pertaining to (4), when the communicator receives, from the second battery pack, response information that is based on the request signal that the communicator transmits to the second battery pack, the controller may cause the communicator to transmit the response information that the communicator receives from the second battery pack to the communication terminal to be displayed on the display.

This structure enables causing a display of a communication terminal to collectively present the status of the secondary battery of a plurality of battery packs.

(6) In the battery pack pertaining to (1) or (4), the generator may generate the response information to further include information indicating a positional relationship between the battery pack and the second battery pack.

This structure enables acquiring the positional relationship between battery packs and associating a status of the secondary battery with each of the battery packs.

(7) In the battery pack pertaining to (6), the generator may generate the response information to further include information indicating a positional relationship between the battery pack and the first battery pack.

This structure enables an external communication device to accurately acquire the positional relationship between battery packs.

(8) In the battery pack pertaining to (1), the communicator may perform the short-distance wireless communication with at least one battery pack that is adjacent to the battery pack in an arrangement where the battery pack and the battery packs with the same structure are linearly disposed in a same orientation.

This structure eliminates the need of changing the arrangement of battery packs between different scenes (i.e., transport of the battery packs, storage of the battery packs, etc.,) and enables concurrently acquiring the status of the secondary battery from a plurality of battery packs with the battery packs arranged in a well-organized state suitable for transport, storage, etc.

(9) In the battery pack pertaining to (8), the housing may be hexahedral, and may have top and bottom surfaces in a height direction, left and right surfaces in a width direction, and front and rear surfaces in a depth direction, in the arrangement, the battery pack and the battery packs with the same structure may be linearly disposed one on top of another in the height direction, the short-distance wireless communication may be near-field communication, and the battery pack may further comprise communication antennas for the near-field communication, the communication antennas being connected with the communicator and composed of a communication antenna provided to the top surface and a communication antenna provided to the bottom surface.

Thus structure enables a battery pack included in a stack of a plurality of battery packs to communicate with battery packs adjacent thereto in the vertical direction.

(10) In the battery pack pertaining to (9), when the communicator receives the request signal from the first battery pack via one of the communication antennas, the controller may cause the communicator to transmit the request signal to the second battery pack from the other one of the communication antennas.

This structure prevents a battery pack in a stack of battery packs that receives a request signal from a given entity from incorrectly transmitting the request signal to the given entity, while enabling the request signal to be passed on to all battery packs that have not yet received the request signal.

(11) The battery pack pertaining to (10) may further include a side surface antenna that is for the near-field communication, the side surface antenna connected with the communicator and provided to one of the left and right surfaces, and in the battery pack, when the communicator receives the request signal from the first battery pack via one of the communication antennas, and does not receive a response to the request signal following transmission of the request signal to the second battery pack from the other one of the communication antennas, the controller may cause the communicator to transmit the request signal from the side surface antenna.

This structure enables an external communication terminal device to transmit the request signal to not only to battery packs located at both ends of a stack of battery packs but to any battery pack in the stack of battery packs. In addition, because battery packs included in a first line are put in contact with battery packs included in a second line via end faces of the battery packs, the status of the secondary battery is acquirable from each of the battery packs stacked and arranged to form two lines.

(12) In the battery pack pertaining to (1), when the communicator receives the request signal from the first battery pack, the controller may cause the communicator to transmit a reception notification to the first battery pack in response to the request signal, and when the communicator receives the request signal from the first battery pack, transmits the request signal to the second battery pack, and receives a reception notification from the second battery pack in response to the request signal that the communicator transmits to the second battery pack, the controller may cause the communicator to transmit the response information to the first battery pack only after the communicator receives response information in response to the request signal that the communicator transmits to the second battery pack.

This structure enables a battery pack to determine whether or not a battery pack adjacent thereto exists, in order to prevent a situation where even through a battery pack adjacent thereto does not exist, the battery pack waits to receive response information from an adjacent battery pack. In addition, this structure prevents a situation where battery packs adjacent to one another each transmit response information separately.

(13) In the battery pack pertaining to (1), the request signal may be a request for at least one of a remaining battery capacity of the secondary battery in the battery pack and a degradation state of the secondary battery in the battery pack.

This structure enables a user to check the remaining battery capacity, the degradation state, etc., of the secondary battery included in a battery pack.

(14) The battery pack pertaining to (1) may further include a display configured to display the status of the secondary battery in the battery pack, and in the battery pack, when the request signal is a request to display the status of the secondary battery, the controller may cause the display to display the status of the secondary battery in the battery pack.

This structure enables acquiring the status of the secondary battery of a battery pack by viewing the battery pack from the outside.

(15) In the battery pack pertaining to (14), the status of the secondary battery may be at least one of a remaining battery capacity of the secondary battery and a degradation state of the secondary battery, and the request signal may be either a request that the controller cause the communicator to transmit the response information, which includes the information related to the status of the secondary battery, or a request that the controller cause the display to display the status of the secondary battery.

This structure enables a user to check the remaining battery capacity, the degradation state, etc., of the secondary battery.

(16) A battery information display method pertaining to another aspect of the present disclosure is for a battery information display system including a plurality of battery packs and a communication terminal having a display, and is characterized for including: a given battery pack in the battery information display system performing short-distance wireless communication with the communication terminal and other battery packs in the battery information display system, the battery packs in the battery information display system having a same structure with a housing and a secondary battery inside the housing; the given battery pack, when (i) directly or indirectly receiving, from the communication terminal, a request signal that is a request for information related to a status of the secondary battery and (ii) receiving, from another battery pack in the battery information display system, response information including information related to the status of the secondary battery in the another battery pack that the another battery pack generates based on the request signal, generating, based on the request signal, response information including the information related to the status of the secondary battery in the given battery pack in addition to the response information received from the another battery pack; the given battery pack, transmitting the request signal to yet another battery pack in the battery information display system and transmitting the response information that the given battery pack generates to the communication terminal; and the display of the communication terminal, displaying information included in the response information that the given battery pack generates.

A battery information display system pertaining to another aspect of the present disclosure includes a plurality of battery packs and a communication terminal having a display, and is characterized in that the battery packs in the battery information display system have a same structure with a housing and a secondary battery inside the housing, a given battery pack in the battery information display system includes: a communicator configured to perform short-distance wireless communication with the communication terminal and other battery packs in the battery information display system; a generator configured, when the communicator (i) directly or indirectly receives, from the communication terminal, a request signal that is a request for information related to a status of the secondary battery and (ii) receives, from another battery pack in the battery information display system, response information including information related to the status of the secondary battery in the another battery pack that is generated based on the request signal, to generate, based on the request signal, response information including information related to the status of the secondary battery in the given battery pack in addition to the response information that the communicator receives from the another battery pack; and a controller configured to transmit the request signal to yet another battery pack in the battery information display system and transmit the response information that the generator generates to the communication terminal, and the communication terminal includes a display controller configured to cause the display to display information included in the response information received from the given battery pack.

This structure enables acquiring the status of the secondary battery of each of a plurality of battery packs by using a communication terminal with the status of the secondary battery visualized by the communication terminal.

(17) A communication terminal pertaining to another aspect of the present invention is capable of communicating with the battery pack pertaining to (4), and is characterized for including a battery communicator configured to perform communication with the battery pack pertaining to (4); a display configured to display the status of the secondary battery; and a terminal controller configured to generate the request signal, which is a request for information related to the secondary battery, to cause the battery communicator to transmit the request signal to the battery pack pertaining to (4), and when the battery communicator receives the response information from the battery pack pertaining to (4), cause the display to display the status of the secondary battery included in the response information.

A control method pertaining to another aspect of the present disclosure is for a communication terminal capable of communicating with the battery pack pertaining to (4), and is characterized in that the communication terminal includes: a battery communicator configured to perform communication with the battery pack pertaining to (4); and a display, and the control method includes: generating the request signal, which is a request for information related to the secondary battery; causing the battery communicator to transmit the request signal to the battery pack pertaining to (4); receiving the response information from the battery pack pertaining to (4) via the battery communicator; and causing the display to display the information included in the response information.

This structure enables a portable communication terminal to acquire and display information related to the secondary battery from a battery pack.

INDUSTRIAL APPLICABILITY

The battery pack pertaining to the present disclosure is useful as a power source that can be used for transport of electricity. For example, the battery pack pertaining to the present disclosure is useful as an emergency spare power source that can be transported. The battery pack pertaining to the present disclosure is also useful as a multi-purpose power source that is normally used in a vehicle, a small-size power generation facility, a power storage facility or the like, but in a case of emergency or the like, is usable for transport of electricity.

REFERENCE SIGNS LIST

1 Battery pack
11 Housing
111 Bottom face
113 Top face
12 Handles
13 Button
14 Display
15 Connector holder
21 Communicator
22 Antenna
24 Connector
31 Controller
32 Secondary battery

The invention claimed is:

1. A battery pack having a housing and a secondary battery inside the housing, comprising:
   a communicator configured to perform short-distance wireless communication with battery packs with a same structure as the battery pack;
   a generator configured to generate response information including information related to a status of the secondary battery in the battery pack based on a request signal that is a request for information related to the status of the secondary battery, wherein when the communicator receives the request signal from a first battery pack, the generator generates the response information based on the request signal that the communicator receives from the first battery pack; and
   a control circuitry configured to cause the communicator to transmit the response information to an entity from which the communicator receives the request signal and to transmit a second request signal to another battery pack, wherein when the communicator receives the request signal from the first battery pack, the another battery pack is a second battery pack differing from the first battery pack,
   wherein the communicator is further configured to perform the short-distance wireless communication with an information processing terminal having a display and being driven by a power source other than any of the battery packs,
   when the communicator receives the request signal from the information processing terminal, the generator generates the response information based on the request signal, which the communicator receives from the information processing terminal, and
   the generator generates the response information to further include information indicating a positional relationship between the battery pack and the second battery pack.

2. The battery pack of claim 1, wherein
the request signal that the communicator receives from the first battery pack is equivalent to the request signal that the communicator transmits to the second battery pack.

3. The battery pack of claim 1, wherein
when the communicator receives, from the second battery pack, response information that is based on the request signal that the communicator transmits to the second battery pack, the generator generates the response information by adding information related to the status of the secondary battery in the battery pack to the response information that the communicator receives from the second battery pack.

4. The battery pack of claim 1, wherein
when the communicator receives, from the second battery pack, response information that is based on the request signal that the communicator transmits to the second battery pack, the control circuitry causes the communicator to transmit the response information that the communicator receives from the second battery pack to the information processing terminal to be displayed on the display.

5. The battery pack of claim 1, wherein
the generator generates the response information to further include information indicating a positional relationship between the battery pack and the first battery pack.

6. The battery pack of claim 1, wherein
the communicator performs the short-distance wireless communication with at least one other battery pack that is adjacent to the battery pack in an arrangement where the battery pack and the battery packs with the same structure are linearly disposed in a same orientation.

7. The battery pack of claim 6, wherein
the housing is hexahedral, and has top and bottom surfaces in a height direction, left and right surfaces in a width direction, and front and rear surfaces in a depth direction,
in the arrangement, the battery pack and the battery packs with the same structure are linearly disposed one on top of another in the height direction,
the short-distance wireless communication is near-field communication, and
the battery pack further comprises communication antennas for the near-field communication, the communication antennas being connected with the communicator and composed of a communication antenna provided to the top surface and a communication antenna provided to the bottom surface.

8. The battery pack of claim 7, wherein
when the communicator receives the request signal from the first battery pack via one of the communication antennas, the control circuitry causes the communicator to transmit the request signal to the second battery pack from the other one of the communication antennas.

9. The battery pack of claim 1, wherein
when the communicator receives the request signal from the first battery pack, the control circuitry causes the communicator to transmit a reception notification to the first battery pack in response to the request signal, and
when the communicator receives the request signal from the first battery pack, transmits the request signal to the second battery pack, and receives a reception notification from the second battery pack in response to the request signal that the communicator transmits to the second battery pack, the control circuitry causes the communicator to transmit the response information to the first battery pack only after the communicator receives response information in response to the request signal that the communicator transmits to the second battery pack.

10. The battery pack of claim 1, wherein
the request signal is a request for at least one of a remaining battery capacity of the secondary battery in the battery pack and a degradation state of the secondary battery in the battery pack.

11. The battery pack of claim 1 further comprising
a display configured to display the status of the secondary battery in the battery pack,
wherein
when the request signal is a request to display the status of the secondary battery, the control circuitry causes the display to display the status of the secondary battery in the battery pack.

12. The battery pack of claim 11, wherein
the status of the secondary battery is at least one of a remaining battery capacity of the secondary battery and a degradation state of the secondary battery, and
the request signal is either a request that the control circuitry cause the communicator to transmit the response information, which includes the information related to the status of the secondary battery, or a request that the control circuitry cause the display to display the status of the secondary battery.

13. An information processing terminal capable of communicating with the battery pack of claim 1, comprising:
a battery communicator configured to perform communication with the battery pack of claim 1;
a display configured to display the status of the secondary battery; and
a terminal control circuitry configured to generate the request signal, which is a request for information related to the secondary battery, to cause the battery communicator to transmit the request signal to the battery pack of claim 1, and when the battery communicator receives the response information from the battery pack of claim 1, cause the display to display the status of the secondary battery included in the response information.

14. A control method for an information processing terminal capable of communicating with the battery pack of claim 1, wherein
the information processing terminal includes: a battery communicator configured to perform communication with the battery pack of claim 1; and a display, and
the control method comprises:
generating the request signal, which is a request for information related to the secondary battery;
causing the battery communicator to transmit the request signal to the battery pack of claim 1;
receiving the response information from the battery pack of claim 1 via the battery communicator; and
causing the display to display the information included in the response information.

15. A battery pack having a housing and a secondary battery inside the housing, comprising:
a communicator configured to perform short-distance wireless communication with battery packs with a same structure as the battery pack;
a generator configured to generate response information including information related to a status of the secondary battery in the battery pack based on a request signal that is a request for information related to the status of the secondary battery, wherein when the communicator receives the request signal from a first battery pack, the generator generates the response information based on the request signal that the communicator receives from the first battery pack;
a control circuitry configured to cause the communicator to transmit the response information to an entity from which the communicator receives the request signal and to transmit a second request signal to another battery pack, wherein when the communicator receives the request signal from the first battery pack, the another battery pack is a second battery pack differing from the first battery pack; and
a side surface antenna that is for the near-field communication, the side surface antenna connected with the communicator and provided to one of the left and right surfaces,
wherein
the communicator performs the short-distance wireless communication with at least one other battery pack that is adjacent to the battery pack in an arrangement where the battery pack and the battery packs with the same structure are linearly disposed in a same orientation,
wherein
the housing is hexahedral, and has top and bottom surfaces in a height direction, left and right surfaces in a width direction, and front and rear surfaces in a depth direction,
in the arrangement, the battery pack and the battery packs with the same structure are linearly disposed one on top of another in the height direction,
the short-distance wireless communication is near-field communication, and
the battery pack further comprises communication antennas for the near-field communication, the communication antennas being connected with the communicator and composed of a communication antenna provided to the top surface and a communication antenna provided to the bottom surface,
wherein
when the communicator receives the request signal from the first battery pack via one of the communication antennas, the control circuitry causes the communicator to transmit the request signal to the second battery pack from the other one of the communication antennas, and
wherein
when the communicator receives the request signal from the first battery pack via one of the communication antennas, and does not receive a response to the request signal following transmission of the request signal to the second battery pack from the other one of the communication antennas, the control circuitry causes the communicator to transmit the request signal from the side surface antenna.

16. A battery information display method for a battery information display system including a plurality of battery packs and an information processing terminal having a display, the method comprising:
a given battery pack in the battery information display system performing short-distance wireless communication with the information processing terminal and other battery packs in the battery information display system, the information processing terminal having a display and being driven by a power source other than any of the plurality of battery packs of the battery information display system and the battery packs in the battery information display system having a same structure with a housing and a secondary battery inside the housing;
the given battery pack, when (i) directly or indirectly receiving, from the information processing terminal, a request signal that is a request for information related to a status of the secondary battery and (ii) receiving, from another battery pack in the battery information display system, response information including information related to the status of the secondary battery in the another battery pack that the another battery pack generates based on the request signal, generating, based on the request signal, response information including the information related to the status of the secondary battery in the given battery pack and information indicating a positional relationship between the battery pack and the another battery pack in addition to the response information received from the another battery pack;

the given battery pack, transmitting the request signal to yet another battery pack in the battery information display system and transmitting the response information that the given battery pack generates to the information processing terminal; and the display of the information processing terminal, displaying information included in the response information that the given battery pack generates.

17. A battery information display system including a plurality of battery packs and an information processing terminal having a display, wherein the battery packs in the battery information display system have a same structure with a housing and a secondary battery inside the housing, a given battery pack in the battery information display system comprises:

a communicator configured to perform short-distance wireless communication with the information processing terminal and other battery packs in the battery information display system, the information processing terminal having a display and being driven by a power source other than any of the plurality of battery packs of the battery information display system;

a generator configured, when the communicator (i) directly or indirectly receives, from the information processing terminal, a request signal that is a request for information related to a status of the secondary battery and (ii) receives, from another battery pack in the battery information display system, response information including information related to the status of the secondary battery in the another battery pack that is generated based on the request signal, to generate, based on the request signal, response information including information related to the status of the secondary battery in the given battery pack and information indicating a positional relationship between the battery pack and the another battery pack in addition to the response information that the communicator receives from the another battery pack; and a control circuitry configured to transmit the request signal to yet another battery pack in the battery information display system and transmit the response information that the generator generates to the information processing terminal, and the information processing terminal comprises a display control circuitry configured to cause the display to display information included in the response information received from the given battery pack.

* * * * *